US012771309B2

(12) United States Patent
Yamaji et al.

(10) Patent No.: US 12,771,309 B2
(45) Date of Patent: Oct. 20, 2026

(54) ACOUSTIC WAVE DEVICE INCLUDING MULTI-COMPONENT PROTECTIVE FILM

(71) Applicant: Murata Manufacturing Co., Ltd., Nagaokakyo (JP)

(72) Inventors: Toru Yamaji, Nagaokakyo (JP); Sunao Yamazaki, Nagaokakyo (JP); Hiroya Suzuki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 58 days.

(21) Appl. No.: 18/960,125

(22) Filed: Nov. 26, 2024

(65) Prior Publication Data

US 2025/0112612 A1 Apr. 3, 2025

Related U.S. Application Data

(63) Continuation of application No. PCT/JP2023/020181, filed on May 30, 2023.

(Continued)

(51) Int. Cl.
*H03H 9/02* (2006.01)
*C23C 16/40* (2006.01)

(Continued)

(52) U.S. Cl.
CPC ......... *H03H 9/02086* (2013.01); *C23C 16/40* (2013.01); *G03F 1/48* (2013.01);

(Continued)

(58) Field of Classification Search
CPC .. H03H 9/02086; H03H 3/10; H03H 9/02015; H03H 9/02157; H03H 9/02228;

(Continued)

(56) References Cited

U.S. PATENT DOCUMENTS

2001/0045793 A1 11/2001 Misu et al.
2003/0122453 A1 7/2003 Yamada et al.

(Continued)

FOREIGN PATENT DOCUMENTS

JP 2000209063 A 7/2000
JP 2005142629 A 6/2005

(Continued)

OTHER PUBLICATIONS

International Search Report in PCT/JP2023/020181, mailed Aug. 22, 2023, 3 pages.

(Continued)

*Primary Examiner* — Andrea Lindgren Baltzell
*Assistant Examiner* — Victor Cole
(74) *Attorney, Agent, or Firm* — Keating & Bennett, LLP

(57) ABSTRACT

An acoustic wave device includes a piezoelectric layer, at least one pair of electrodes, and a protective film. The piezoelectric layer includes first and second major surfaces opposing each other in a first direction. The at least one pair of electrodes are on at least one of the first and second major surfaces. The protective film covers at least a portion of the pair of electrodes. The protective film includes a first-component insulative film including a first component and in contact with the pair of electrodes, and a second-component insulative film including a second component and located at the surface layer of the protective film. The first-component insulative film has a higher moisture resistance than the second-component insulative film. The second-component insulative film has a higher plasma resistance than the first-component insulative film.

28 Claims, 24 Drawing Sheets

Related U.S. Application Data

(60) Provisional application No. 63/347,186, filed on May 31, 2022.

(51) Int. Cl.

| | |
|---|---|
| ***G03F 1/48*** | (2012.01) |
| ***H03H 3/10*** | (2006.01) |
| ***H03H 9/05*** | (2006.01) |
| ***H03H 9/145*** | (2006.01) |
| ***H03H 9/25*** | (2006.01) |
| ***H10P 14/69*** | (2026.01) |

(52) U.S. Cl.
CPC .......... *H03H 3/10* (2013.01); *H03H 9/02015* (2013.01); *H03H 9/02157* (2013.01); *H03H 9/02228* (2013.01); *H03H 9/0504* (2013.01); *H03H 9/145* (2013.01); *H03H 9/25* (2013.01); *H10P 14/69* (2026.01)

(58) Field of Classification Search
CPC ........ H03H 9/0504; H03H 9/25; H03H 9/145; C23C 16/40; G03F 1/48; H10P 14/69
USPC .............. 333/187, 193; 310/313 R; 427/250; 438/104
See application file for complete search history.

(56) References Cited

U.S. PATENT DOCUMENTS

| | | | | |
|---|---|---|---|---|
| 2016/0156331 | A1 | 6/2016 | Miwa et al. | |
| 2018/0048280 | A1 | 2/2018 | Ryder et al. | |
| 2018/0145655 | A1 | 5/2018 | Tsutsumi et al. | |
| 2018/0269848 | A1 | 9/2018 | Matsuda et al. | |
| 2019/0386633 | A1* | 12/2019 | Plesski | H03H 9/54 |
| 2019/0386642 | A1 | 12/2019 | Komatsu | |
| 2020/0007108 | A1* | 1/2020 | Huebner | H03H 9/6489 |
| 2020/0036357 | A1 | 1/2020 | Mimura | |
| 2021/0028762 | A1 | 1/2021 | Kay et al. | |
| 2022/0103159 | A1* | 3/2022 | Shin | H04B 1/40 |
| 2023/0275556 | A1 | 8/2023 | Kimura et al. | |

FOREIGN PATENT DOCUMENTS

| | | | |
|---|---|---|---|
| JP | 2005150787 | A | 6/2005 |
| JP | 2011244065 | A | 12/2011 |
| JP | 2012257019 | A | 12/2012 |
| JP | 2018085651 | A | 5/2018 |
| JP | 2018157564 | A | 10/2018 |
| JP | 2019068309 | A | 4/2019 |
| JP | 2019527834 | A | 10/2019 |
| JP | 2019216422 | A | 12/2019 |
| WO | 02082645 | A1 | 10/2002 |
| WO | 2015022931 | A1 | 2/2015 |
| WO | 2018198654 | A1 | 11/2018 |
| WO | 2022102719 | A1 | 5/2022 |

OTHER PUBLICATIONS

Written Opinion in PCT/JP2023/020181, mailed Aug. 22, 2023, 10 pages.

* cited by examiner

ACOUSTIC WAVE DEVICE INCLUDING MULTI-COMPONENT PROTECTIVE FILM

CROSS REFERENCE TO RELATED APPLICATIONS

This application claims the benefit of priority to Provisional Application No. 63/347,186 filed on May 31, 2022 and is a Continuation Application of PCT Application No. PCT/JP2023/020181 filed on May 30, 2023. The entire contents of each application are hereby incorporated herein by reference.

BACKGROUND OF THE INVENTION

1. Field of the Invention

The present disclosure relates to acoustic wave devices.

2. Description of the Related Art

Japanese Unexamined Patent Application Publication No. 2012-257019 describes an acoustic wave device.

In the acoustic wave device disclosed in Japanese Unexamined Patent Application Publication No. 2012-257019, a protective film is stacked over a functional electrode in some cases in order to obtain desired frequency characteristics. In such cases, fluctuations in frequency characteristics can occur due to moisture absorption by the protective film, deterioration of the protective film caused by exposure to plasma during manufacture of the acoustic wave device, or other factors.

SUMMARY OF THE INVENTION

Example embodiments of the present invention reduce or prevent fluctuations in frequency characteristics.

An acoustic wave device according to an example embodiment of the present invention includes a piezoelectric layer, at least one pair of electrodes, and a protective film. The piezoelectric layer includes a first major surface and a second major surface opposed to each other in a first direction. The at least one pair of electrodes are located on at least one of the first major surface or the second major surface. The protective film covers at least a portion of the pair of electrodes. The protective film includes a first-component insulative film including a first component and in contact with the pair of electrodes, and a second-component insulative film including a second component and located at a surface layer of the protective film. The first-component insulative film has a higher moisture resistance than the second-component insulative film. The second-component insulative film has a higher plasma resistance than the first-component insulative film.

An acoustic wave device according to an example embodiment of the present invention includes a piezoelectric layer, at least one pair of electrodes, and a protective film. The piezoelectric layer includes a first major surface and a second major surface that are opposed to each other in a first direction. The at least one pair of electrodes are located on at least one of the first major surface or the second major surface. The protective film covers at least a portion of the pair of electrodes. The protective film includes a first-component insulative film including a first component and in contact with the pair of electrodes, and a second-component insulative film including a second component and located at a surface layer of the protective film. The first-component insulative film is a silicon nitride film, and the second-component insulative film is a silicon oxynitride film.

An acoustic wave device according to an example embodiment of the present invention includes a piezoelectric layer, at least one pair of electrodes, and a protective film. The piezoelectric layer includes a first major surface and a second major surface that are opposed to each other in a first direction. The at least one pair of electrodes are located on at least one of the first major surface or the second major surface. The protective film covers at least a portion of the pair of electrodes. The protective film includes a first-component insulative film including a first component and in contact with the pair of electrodes, and a second-component insulative film including a second component and located at a surface layer of the protective film. The first-component insulative film is a silicon nitride film, and the second-component insulative film is a silicon oxide film.

An acoustic wave device according to an example embodiment of the present invention includes a piezoelectric layer, at least one pair of electrodes, and a protective film. The piezoelectric layer includes a first major surface and a second major surface that are opposed to each other in a first direction. The at least one pair of electrodes are located on at least one of the first major surface or the second major surface. The protective film covers at least a portion of the pair of electrodes. The protective film includes a first-component insulative film including a first component and in contact with the pair of electrodes, and a second-component insulative film including a second component and located at a surface layer of the protective film. The first-component insulative film and the second-component insulative film are each a silicon oxynitride film, and the second-component insulative film has a higher oxygen content than the first-component insulative film.

An acoustic wave device according to an example embodiment of the present invention includes a piezoelectric layer, at least one pair of electrodes, and a protective film. The piezoelectric layer includes a first major surface and a second major surface that are opposed to each other in a first direction. The at least one pair of electrodes are located on at least one of the first major surface or the second major surface. The protective film covers at least a portion of the pair of electrodes. The protective film includes a first-component insulative film including a first component and in contact with the pair of electrodes, and a second-component insulative film including a second component and located at a surface layer of the protective film. The first-component insulative film is a silicon oxynitride film, and the second-component insulative film is a silicon oxide film.

An acoustic wave device according to an example embodiment of the present invention includes a piezoelectric layer, at least one pair of electrodes, and a protective film. The piezoelectric layer includes a first major surface and a second major surface that are opposed to each other in a first direction. The at least one pair of electrodes are located on at least one of the first major surface or the second major surface. The protective film covers at least a portion of the pair of electrodes. The protective film includes a first-component insulative film including a first component and in contact with the pair of electrodes, and a second-component insulative film including a second component and located at a surface layer of the protective film. The first-component insulative film and the second-component insulative film are each an aluminum oxide film, and the second-component insulative film has a higher oxygen content than the first-component insulative film.

An acoustic wave device according to an example embodiment of the present invention includes a piezoelectric layer, at least one pair of electrodes, and a protective film. The piezoelectric layer includes a first major surface and a second major surface that are opposite from each other in a first direction. The at least one pair of electrodes are located on at least one of the first major surface or the second major surface. The protective film covers at least a portion of the pair of electrodes. The protective film includes a first-component insulative film including a first component and in contact with the pair of electrodes, and a second-component insulative film including a second component and located at a surface layer of the protective film. The first-component insulative film and the second-component insulative film are each a titanium oxide film, and the second-component insulative film has a higher oxygen content than the first-component insulative film.

An acoustic wave device according to an example embodiment of the present invention includes a piezoelectric layer, at least one pair of electrodes, and a protective film. The piezoelectric layer includes a first major surface and a second major surface that are opposite from each other in a first direction. The at least one pair of electrodes are located on at least one of the first major surface or the second major surface. The protective film covers at least a portion of the pair of electrodes. The protective film includes a first-component insulative film including a first component and in contact with the pair of electrodes, and a second-component insulative film including a second component and located at a surface layer of the protective film. The first-component insulative film and the second-component insulative film are each a tantalum oxide film, and the second-component insulative film has a higher oxygen content than the first-component insulative film.

According to example embodiments of the present invention, fluctuations in frequency characteristics can be reduced or prevented.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Example embodiments of the present invention are described below in detail with reference to the drawings. These example embodiments, however, are not intended to be limiting of the present invention. The disclosed example embodiments are intended to be illustrative only. Modifications that enable features to be partially combined or replaced with each other between different example embodiments, and matters described with reference to the second and subsequent example embodiments that are the same or substantially the same as those described with reference to the first example embodiment are not described in further detail, and the following description focuses only on differences. In particular, the same or similar operational and advantageous effects provided by the same or similar features are not described for each individual example embodiment.

First Example Embodiment

Figure 1A:
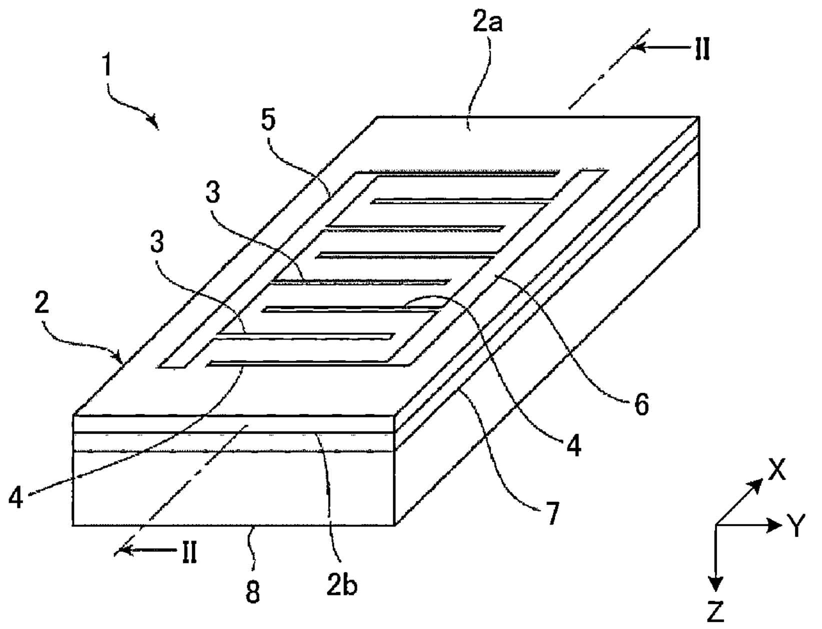
FIG. 1A is a perspective view of an acoustic wave device according to a first example embodiment of the present invention.
Figure 1B:
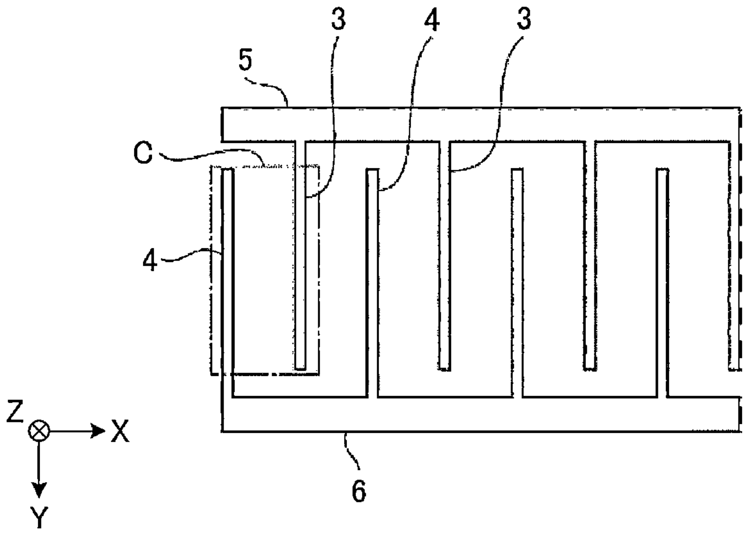
FIG. 1B is a plan view of an arrangement of electrodes according to the first example embodiment of the present invention.

FIG. 1A is a perspective view of an acoustic wave device according to a first example embodiment of the present invention. FIG. 1B is a plan view of an arrangement of electrodes according to the first example embodiment.

An acoustic wave device 1 according to the first example embodiment includes a piezoelectric layer 2 made of, for example, $LiNbO_3$. The piezoelectric layer 2 may be made of, for example, $LiTaO_3$. The $LiNbO_3$ or $LiTaO_3$ used has a Z-cut angle according to the first example embodiment. The $LiNbO_3$ or $LiTaO_3$ used may have a rotated Y-cut angle or an X-cut angle. Preferred orientations of propagation are, for example, Y-propagation and X-propagation about ±30°.

Although the thickness of the piezoelectric layer 2 is not particularly limited, from the viewpoint of effectively exciting a first-order thickness shear mode, the piezoelectric layer 2 preferably has, for example, a thickness of greater than or equal to about 50 nm and less than or equal to about 1000 nm. An electrode finger 3 and an electrode finger 4 may be disposed on a second major surface 2*b*.

The piezoelectric layer 2 includes a first major surface 2*a* and the second major surface 2*b* that are opposed to each other in a Z-direction. The electrode finger 3 and the electrode finger 4 are disposed on the first major surface 2*a*.

The electrode finger 3 corresponds to an example of a "first electrode finger", and the electrode finger 4 corresponds to an example of a "second electrode finger." In FIGS. 1A and 1B, a plurality of electrode fingers 3 connected to a first busbar 5 correspond to a plurality of "first electrode fingers." A plurality of electrode fingers 4 connected to a second busbar correspond to a plurality of "second electrode fingers." The electrode fingers 3 and the electrode fingers 4 are interdigitated with each other. Accordingly, the electrode finger 3, the electrode finger 4, the first busbar 5, and the second busbar 6 constitute an interdigital transducer (IDT) electrode.

Each of the electrode finger 3 and the electrode finger 4 is rectangular or substantially rectangular in shape, and has a longitudinal direction. In a direction orthogonal or substantially orthogonal to the longitudinal direction, the electrode finger 3, and the electrode finger 4 adjacent to the electrode finger 3 surface each other. The longitudinal direction of the electrode fingers 3 and 4, and the direction orthogonal or substantially orthogonal to the longitudinal direction of the electrode fingers 3 and 4 are each a direction that crosses the thickness direction of the piezoelectric layer 2. It can thus be said that the electrode finger 3, and the electrode finger 4 adjacent to the electrode finger 3 surface each other in the direction that crosses the thickness direction of the piezoelectric layer 2. In the following description, it will be sometimes assumed that the thickness direction of the piezoelectric layer 2 is a Z-direction (or a first direction), the longitudinal direction of the electrode fingers 3 and 4 is a Y-direction (or a second direction), and the direction orthogonal or substantially orthogonal to the electrode fingers 3 and 4 is an X-direction (or a third direction).

The longitudinal direction of the electrode fingers 3 and 4 may be interchanged with the direction orthogonal or substantially orthogonal to the longitudinal direction of the electrode fingers 3 and 4 illustrated in FIGS. 1A and 1B. That is, the electrode finger 3 and the electrode finger 4 may extend in a direction in which the first busbar 5 and the second busbar 6 extend in FIGS. 1A and 1B. In that case, the first busbar 5 and the second busbar 6 extend in a direction in which the electrode finger 3 and the electrode finger 4 extend in FIGS. 1A and 1B. A plurality of pairs of mutually adjacent electrode fingers, each pair including the electrode finger 3 connected with one potential and the electrode finger 4 connected with the other potential, are disposed in the direction orthogonal or substantially orthogonal to the longitudinal direction of the electrode fingers 3 and 4.

When it is stated herein that the electrode finger 3 and the electrode finger 4 are adjacent to each other, this does not mean that the electrode finger 3 and the electrode finger 4 are disposed in direct contact with each other, but means that the electrode finger 3 and the electrode finger 4 are disposed with a spacing therebetween. Further, if the electrode finger 3 and the electrode finger 4 are adjacent to each other, no electrode connected with a hot electrode or a ground electrode, such as another electrode finger 3 or 4, is present between the mutually adjacent electrode fingers 3 and 4. The number of such electrode finger pairs does not necessary be an integer but may be a non-integer such as, for example, 1.5 or 2.5.

The center-to-center distance, that is, the pitch between the electrode fingers 3 and 4 is, for example, preferably greater than or equal to about 1 μm and less than or equal to about 10 μm. The center-to-center distance between the electrode fingers 3 and 4 refers to the distance between the center of the width dimension of the electrode finger 3 in a direction orthogonal or substantially orthogonal to the longitudinal direction of the electrode finger 3, and the center of the width dimension of the electrode finger 4 in a direction orthogonal or substantially orthogonal to the longitudinal direction of the electrode finger 4.

Further, if at least one of the number of electrode fingers 3 or the number of electrode fingers 4 is more than one (i.e., if, with the electrode finger 3 and the electrode finger 4 defined as one pair of electrodes, there are 1.5 or more pairs of electrodes), the center-to-center distance between the electrode fingers 3 and 4 refers to the mean of the center-to-center distances of mutually adjacent electrode fingers 3 and 4 of the 1.5 or more pairs of electrode fingers 3 and 4.

The width of each of the electrode fingers 3 and 4, that is, the dimension of each of the electrode fingers 3 and 4 in a direction in which the electrode fingers 3 and 4 surface each other is, for example, preferably greater than or equal to about 150 nm and less than or equal to about 1000 nm. The center-to-center distance between the electrode fingers 3 and 4 refers to the distance between the center of the dimension (width dimension) of the electrode finger 3 in the direction orthogonal or substantially orthogonal to the longitudinal direction of the electrode finger 3, and the center of the dimension (width dimension) of the electrode finger 4 in the direction orthogonal or substantially orthogonal to the longitudinal direction of the electrode finger 4.

Since the piezoelectric layer according to the first example embodiment is a Z-cut piezoelectric layer, the direction orthogonal or substantially orthogonal to the longitudinal direction of the electrode fingers 3 and 4 is a direction orthogonal or substantially orthogonal to the polarization direction of the piezoelectric layer 2. This, however, does not hold if a piezoelectric with another cut-angle is used as the piezoelectric layer 2. As used herein, the term "orthogonal" may encompass not only strictly orthogonal but also substantially orthogonal (i.e., when the direction orthogonal to the longitudinal direction of the electrode fingers 3 and 4, and the polarization direction make an angle of, for example, about 90°±10°).

Figure 2:
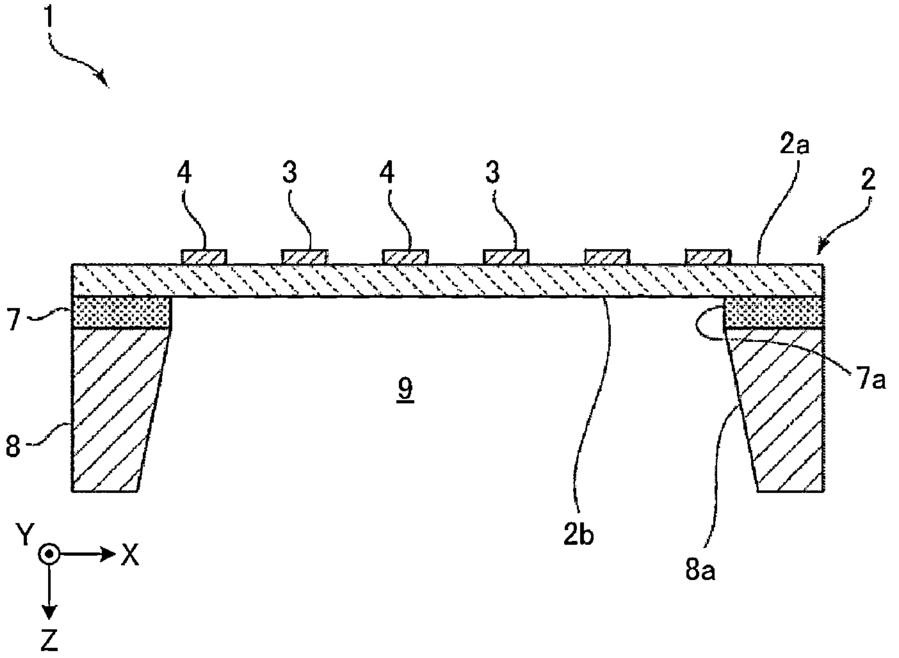
FIG. 2 is a cross-sectional view taken along a line II-II in FIG. 1A.

A support substrate 8 is stacked over the second major surface 2*b* of the piezoelectric layer 2 with an intermediate layer 7 interposed therebetween. The intermediate layer 7 and the support substrate 8 define a support. The intermediate layer 7 and the support substrate 8 have a frame shape, and respectively include a cavity 7*a* and a cavity 8*a* as illustrated in FIG. 2. Due to the configuration described above, an air gap 9 is provided. The support substrate 8 may include a recess. The air gap 9 may be defined by a recess provided in the intermediate layer.

The air gap 9 is provided so that vibration of an excitation region C of the piezoelectric layer 2 is not prevented. Accordingly, the support substrate 8 is stacked over the second major surface 2*b* with the intermediate layer 7 interposed therebetween, at a location not overlapping an area where at least one pair of electrode fingers 3 and 4 is present. The support substrate 8 may be stacked directly or indirectly over the second major surface 2*b* of the piezoelectric layer 2. That is, no intermediate layer 7 may be provided. In that case, the support substrate 8 defines the support.

The intermediate layer 7 is made of, for example, silicon oxide. The intermediate layer 7 may, however, be made of any suitable insulative material other than silicon oxide, such as, for example, silicon nitride or alumina.

The support substrate 8 is made of, for example, Si. The plane orientation of a surface of Si near the piezoelectric layer 2 may be (100) or (110), or may be (111). Preferably, for example, the Si used has a high resistivity greater than or equal to about 4 kΩ. However, the support substrate 8 may be made of any suitable insulative material or semiconductor material. Examples of suitable materials of the support substrate 8 may include piezoelectrics such as aluminum oxide, lithium tantalate, lithium niobate, and quartz, various ceramics such as alumina, magnesia, sapphire, silicon nitride, aluminum nitride, silicon carbide, zirconia, cordierite, mullite, steatite, and forsterite, dielectrics such as diamond and glass, and semiconductors such as gallium nitride.

The electrode fingers 3, the electrode fingers 4, the first busbar 5, and the second busbar 6 are each made of any suitable metal or alloy such as, for example, Al or AlCu alloy. According to the first example embodiment, each of the electrode finger 3, the electrode finger 4, the first busbar 5, and the second busbar 6 is, for example, a stack of an Al film over a Ti film. However, an adhesion layer other than a Ti film may be used.

In driving, an alternating-current voltage is applied between the electrode fingers 3 and the electrode fingers 4. More specifically, an alternating-current voltage is applied between the first busbar 5 and the second busbar 6. This makes it possible to provide resonance characteristics utilizing bulk waves in first-order thickness shear mode excited in the piezoelectric layer 2.

The acoustic wave device 1 is designed such that, for example, d/p is less than or equal to about 0.5, where d is the thickness of the piezoelectric layer 2, and p is the center-to-center distance between any mutually adjacent electrode fingers 3 and 4 of a plurality of pairs of electrode fingers 3 and 4. This makes it possible to effectively excite the bulk waves in first-order thickness shear mode mentioned above, and consequently provide improved resonance characteristics. More preferably, for example, d/p is less than or equal to about 0.24, in which case further improved resonance characteristics can be provided.

If at least one of the number of electrode fingers 3 or the number of electrode fingers 4 is more than one as with the first example embodiment, that is, if, with the electrode finger 3 and the electrode finger 4 defined as one pair of electrodes, there are 1.5 or more pairs of electrode fingers 3 and 4, then the center-to-center distance between mutually adjacent electrode fingers 3 and 4 refers to the mean of the center-to-center distances of the respective pairs of mutually adjacent electrode fingers 3 and 4.

The above-described configuration of the acoustic wave device 1 according to the first example embodiment makes it possible to reduce a decrease in Q-factor, even if the number of pairs of electrode fingers 3 and 4 is reduced to achieve miniaturization. This is because the resulting resonator does not require a reflector on each side, and thus has reduced insertion loss. The reason why no reflector is required is because bulk waves in first-order thickness shear mode are utilized.

Figure 3A:
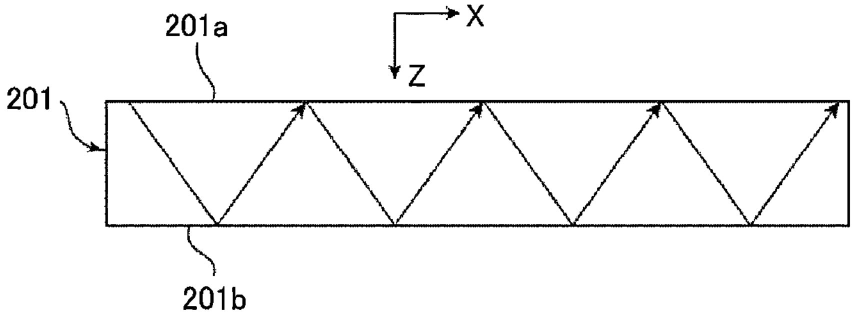
FIG. 3A is a schematic cross-sectional illustration for explaining Lamb waves propagating in a piezoelectric layer according to a Comparative Example.
Figure 3B:
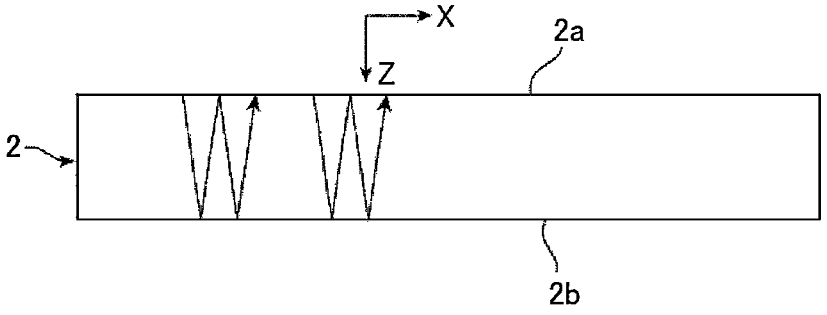
FIG. 3B is a schematic cross-sectional illustration for explaining bulk waves in first-order thickness shear mode that propagate in a piezoelectric layer according to the first example embodiment of the present invention.
Figure 4:
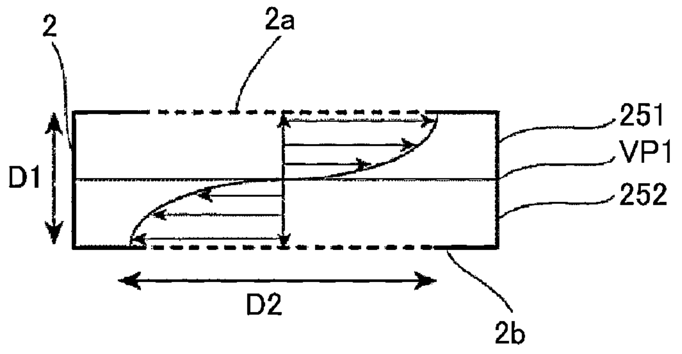
FIG. 4 is a schematic cross-sectional illustration for explaining the amplitude directions of bulk waves in first-order thickness shear mode that propagate in the piezoelectric layer according to the first example embodiment of the present invention.

FIG. 3A is a schematic cross-sectional illustration for explaining Lamb waves propagating in a piezoelectric layer according to a Comparative Example. FIG. 3B is a schematic cross-sectional illustration for explaining bulk waves in first-order thickness shear mode that propagate in the piezoelectric layer according to the first example embodiment. FIG. 4 is a schematic cross-sectional illustration for explaining the amplitude directions of bulk waves in first-order thickness shear mode that propagate in the piezoelectric layer according to the first example embodiment.

FIG. 3A illustrates an acoustic wave device like the one described in Japanese Unexamined Patent Application Publication No. 2012-257019, with Lamb waves propagating in the piezoelectric layer. As illustrated in FIG. 3A, the waves propagate within a piezoelectric layer 201 as indicated by arrows. The piezoelectric layer 201 includes a first major surface 201*a*, and a second major surface 201*b*. The thickness direction connecting the first major surface 201*a* and the second major surface 201*b* is defined as the Z-direction. The X-direction refers to a direction in which the electrode fingers 3 and 4 of the IDT electrode are arranged. As illustrated in FIG. 3A, Lamb waves propagate in the X-direction in the illustrated manner. Although the piezoelectric layer 201 vibrates as a whole due to the Lamb waves being plate waves, since the waves propagate in the X-direction, a reflector is disposed on each side to provide resonance characteristics. This results in wave propagation loss. Therefore, an attempt for miniaturization, that is, a reduction in the number of pairs of electrode fingers 3 and 4 results in a decrease in Q-factor.

In contrast, with the acoustic wave device according to the first example embodiment, vibration displacement occurs in the thickness shear direction as illustrated in FIG. 3B. This results in the waves propagating substantially in the direction connecting the first major surface 2*a* and the second major surface 2*b* of the piezoelectric layer 2, that is, in the Z-direction, to achieve resonance. That is, the waves have an extremely small X-direction component relative to their Z-direction component. Since the wave propagation in the Z-direction provides the resonance characteristics, no reflector is required. This means that no propagation loss due to wave propagation through the reflector occurs. This makes it possible to reduce a decrease in Q-factor, even if the number of pairs of electrode fingers 3 and 4 is reduced in an attempt to achieve further miniaturization.

As illustrated in FIG. 4, the amplitude direction of bulk waves in first-order thickness shear mode is opposite between a first region 251 and a second region 252, which are included in the excitation region C of the piezoelectric layer 2 (see FIG. 1B). FIG. 4 schematically illustrates bulk waves generated upon application of a voltage between the electrode finger 3 and the electrode finger 4 such that the electrode finger 4 is at a higher potential than the electrode finger 3. The first region 251 is a portion of the excitation region C located between a virtual plane VP1 and the first major surface 2*a*. The virtual plane VP1 is a plane orthogonal or substantially orthogonal to the thickness direction of the piezoelectric layer 2 and dividing the piezoelectric layer 2 into two regions. The second region 252 is a portion of the excitation region C located between the virtual plane VP1 and the second major surface 2*b*.

As described above, the acoustic wave device 1 includes at least one pair of electrodes including the electrode finger 3 and the electrode finger 4. Since the acoustic wave device 1 is not designed for wave propagation in the X-direction, the acoustic wave device 1 does not necessarily need to include a plurality of such electrode pairs each including the electrode finger 3 and the electrode finger 4. That is, the acoustic wave device 1 may simply include at least one pair of electrodes.

For example, the electrode finger 3 is an electrode to be connected with a hot potential, and the electrode finger 4 is an electrode to be connected with a ground potential. Alternatively, however, the electrode finger 3 may be connected with a ground potential, and the electrode finger 4 may be connected with a hot potential. According to the first example embodiment, at least one pair of electrodes includes an electrode to be connected with a hot potential or an electrode to be connected with a ground potential as described above, and no floating electrode is provided.

Figure 5:
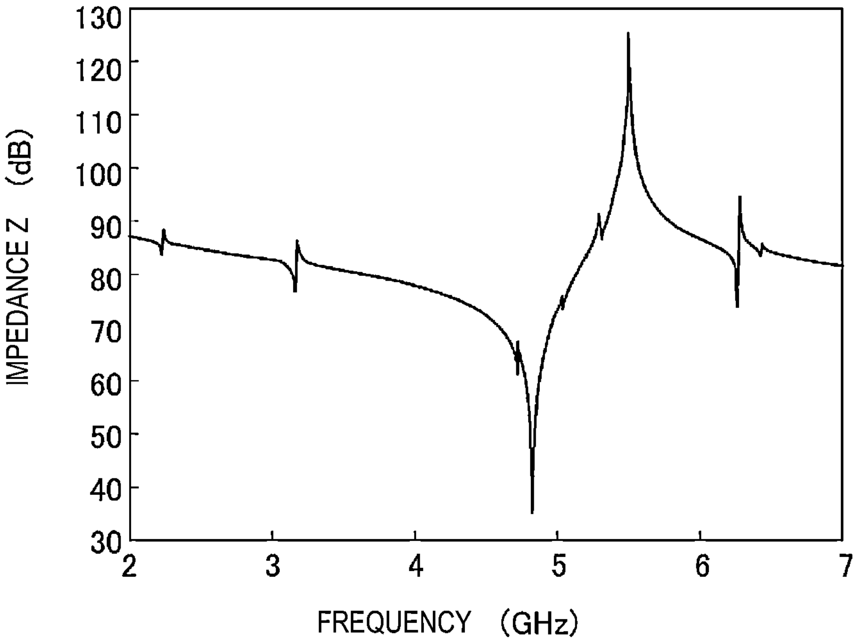
FIG. 5 illustrates an example of the resonance characteristics of the acoustic wave device according to the first example embodiment of the present invention.

FIG. 5 illustrates an example of the resonance characteristics of the acoustic wave device according to the first example embodiment. The acoustic wave device 1 with the resonance characteristics illustrated in FIG. 5 has design parameters described below.

Piezoelectric layer 2: $LiNbO_3$ with Euler angles (0°, 0°, 90°)

Thickness of piezoelectric layer 2: about 400 nm

Length of excitation region C (see FIG. 1B): about 40 μm

Number of electrode pairs each including electrode fingers 3 and 4: 21

Center-to-center distance (pitch) p between electrode fingers 3 and 4: about 3 μm Width of electrode fingers 3 and 4: about 500 nm d/p: about 0.133

Intermediate layer 7: silicon oxide film with thickness of about 1 μm

Support substrate 8: Si

The excitation region C (see FIG. 1B) refers to a region where the electrode fingers 3 and 4 overlap each other as seen in the X-direction, which is a direction orthogonal or substantially orthogonal to the longitudinal direction of the electrode fingers 3 and 4. The length of the excitation region C refers to a dimension of the excitation region C in the longitudinal direction of the electrode fingers 3 and 4. The excitation region C is an example of "intersecting region."

According to the first example embodiment, the center-to-center distance is set equal or substantially equal between all electrode pairs each including the electrode fingers 3 and 4. That is, the electrode fingers 3 and 4 are disposed at equal or substantially equal pitches.

As can be appreciated from FIG. 5, improved resonance characteristics with a fractional bandwidth of, for example, about 12.5% are obtained, even though no reflector is provided.

According to the first example embodiment, for example, d/p is less than or equal to about 0.5, more preferably less than or equal to about 0.24, where d is the thickness of the piezoelectric layer 2, and p is the center-to-center distance between the electrode finger 3 and the electrode finger 4. This is explained below with reference to FIG. 6.

Figure 6:
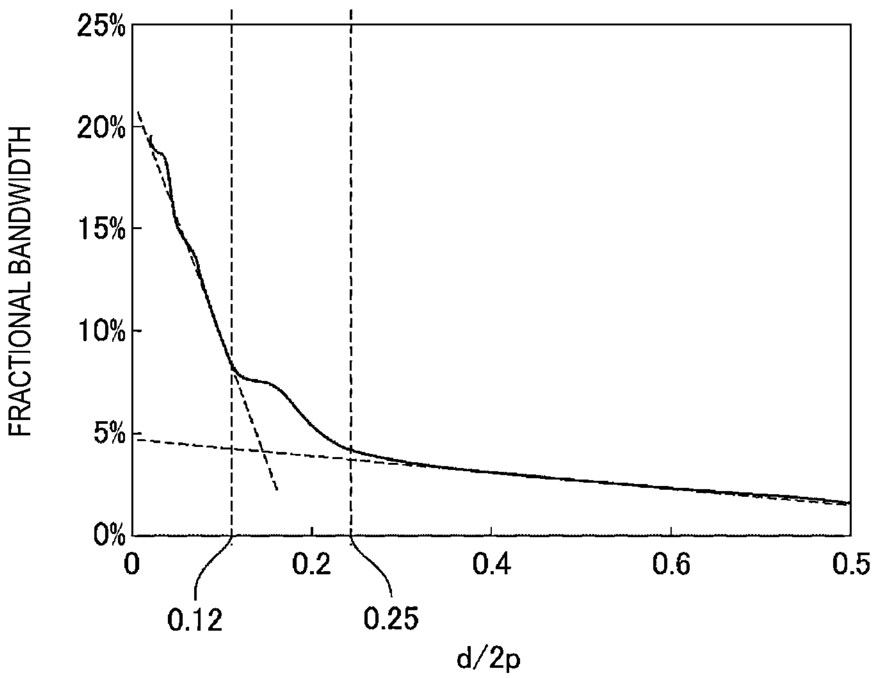
FIG. 6 illustrates, for the acoustic wave device according to the first example embodiment of the present invention, the relationship between d/2p, and the fractional bandwidth of the acoustic wave device serving as a resonator, where p is the center-to-center distance between mutually adjacent electrodes or the mean center-to-center distance, and d is the mean thickness of the piezoelectric layer.

A plurality of acoustic wave devices are obtained in the same or substantially the same manner as with the acoustic wave device having the resonance characteristics illustrated in FIG. 5, but with varying values of d/2p. FIG. 6 illustrates, for the acoustic wave device according to the first example embodiment, the relationship between d/2p, and the fractional bandwidth of the acoustic wave device serving as a resonator, where p is the center-to-center distance between mutually adjacent electrodes or the mean center-to-center distance, and d is the mean thickness of the piezoelectric layer 2.

As illustrated in FIG. 6, when d/2p exceeds about 0.25, that is, when d/p>about 0.5, the fractional bandwidth remains below about 5% even as d/p is adjusted. By contrast, when d/2p≤about 0.25, that is, when d/p≤about 0.5, varying d/p within this range makes it possible to provide a fractional bandwidth of greater than or equal to about 58, that is, a resonator with a high coupling coefficient. When d/2p is less than or equal to about 0.12, that is, when d/p is less than or equal to about 0.24, the fractional bandwidth can be increased to be greater than or equal to about 78. In addition, adjusting d/p within this range makes it possible to provide a resonator with an even greater fractional bandwidth, and consequently with an even higher coupling coefficient. It can therefore be appreciated that, for example, setting d/p less than or equal to about 0.5 makes it possible to provide a resonator that has a high coupling coefficient and that utilizes the bulk waves in first-order thickness shear mode mentioned above.

The at least one pair of electrodes described above may be one pair of electrodes, in which case the value of p mentioned above is the center-to-center distance between mutually adjacent electrode fingers 3 and 4. If there are, for example, 1.5 or more pairs of electrodes, the mean of the center-to-center distances of mutually adjacent electrode fingers 3 and 4 may be used as the value of p.

Similarly, as for the thickness d of the piezoelectric layer 2, if the piezoelectric layer 2 has thickness variations, its averaged thickness may be used.

Figure 7:
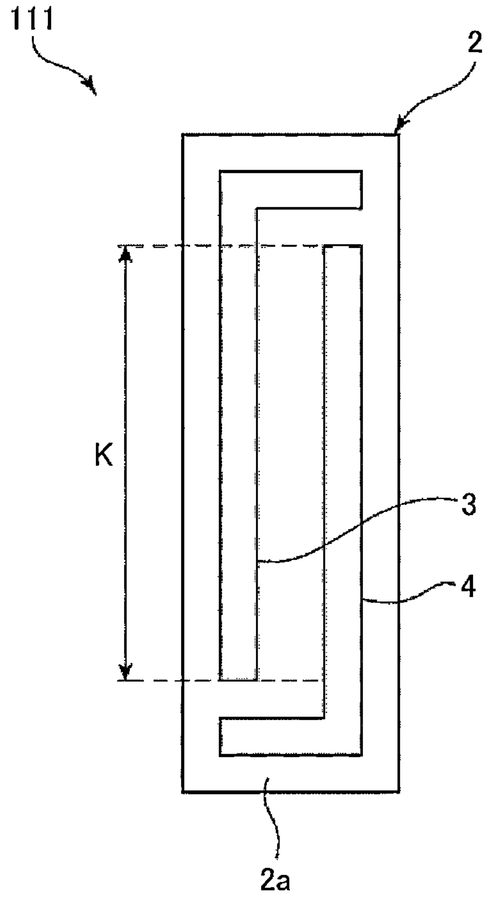
FIG. 7 is a schematic plan view of an example of the acoustic wave device according to the first example embodiment of the present invention that includes one pair of electrodes.

FIG. 7 is a schematic plan view of an example of the acoustic wave device according to the first example embodiment that includes one pair of electrodes. An acoustic wave device 101 includes one electrode pair including the electrode fingers 3 and 4 disposed on the first major surface 2*a* of the piezoelectric layer 2. In FIG. 7, K represents intersecting width. As previously mentioned, the acoustic wave device according to the present disclosure may include one pair of electrodes. In this case as well, bulk waves in first-order thickness shear mode can be effectively excited if, for example, d/p is less than or equal to about 0.5.

In a preferred configuration of the acoustic wave device 1, for example, the following condition is satisfied: MR≤about 1.75(d/p)+0.075, where MR is the metallization ratio of any mutually adjacent electrode fingers 3 and 4 of a plurality of electrode fingers 3 and 4 to the excitation region C, which is a region where the mutually adjacent electrode fingers 3 and 4 overlap as seen in a direction in which the mutually adjacent electrode fingers 3 and 4 surface each other. This allows for effective reduction of spurious response. This is explained below with reference to FIGS. 8 and 9.

Figure 8:
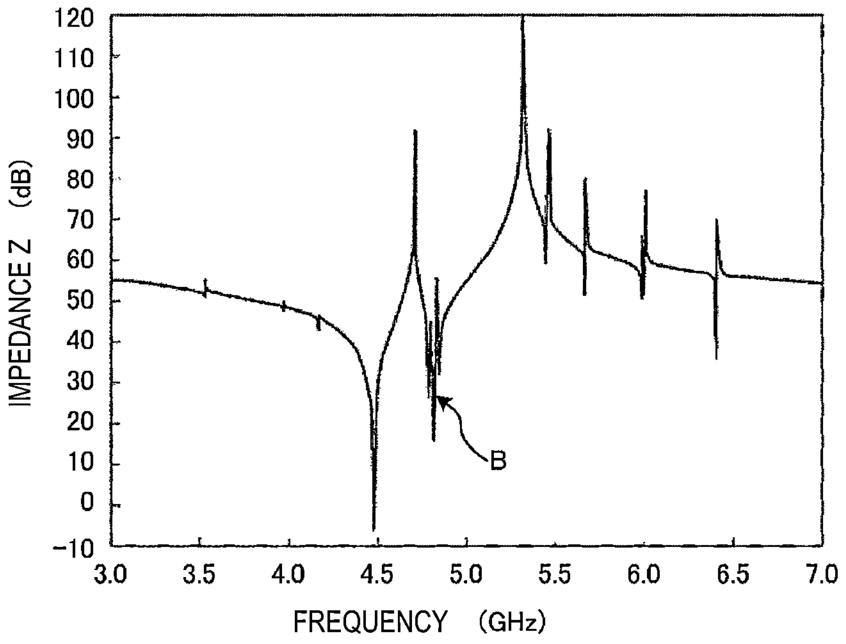
FIG. 8 illustrates, for reference, an example of the resonance characteristics of the acoustic wave device according to the first example embodiment of the present invention.

FIG. 8 illustrates, for reference, an example of the resonance characteristics of the acoustic wave device according to the first example embodiment. A spurious response indicated by an arrow B appears between the resonant frequency and the anti-resonant frequency. d/p is set as d/p=about 0.08, and the Euler Angles of $LiNbO_3$ are set as (0°, 0°, 90°). The metallization ratio MR mentioned above is set as M=about 0.35.

The metallization ratio MR is described below with reference to FIG. 1B. With attention directed to one pair of electrode fingers 3 and 4 in the arrangement of electrodes illustrated in FIG. 1B, it is now assumed that only the one pair of electrode fingers 3 and 4 exist. In this case, the portion bounded by a dash-dot line is the excitation region C. As seen in a direction orthogonal or substantially orthogonal to the longitudinal direction of the electrode fingers 3 and 4, that is, in a direction in which the electrode fingers 3 and 4 surface each other, the excitation region C includes the following regions: a region of the electrode finger 3 that overlaps the electrode finger 4; a region of the electrode finger 4 that overlaps the electrode finger 3; and the region located between the electrode fingers 3 and 4 and where the electrode fingers 3 and 4 overlap each other. In this case, the metallization ratio MR refers to the ratio of the area of the electrode fingers 3 and 4 within the excitation region C to the area of the excitation region C. That is, the metallization ratio MR refers to the ratio of the area of the metallization portion to the area of the excitation region C.

For a case where a plurality of pairs of electrode fingers 3 and 4 are provided, the metallization ratio MR may be defined as a proportion, relative to the sum of the areas of excitation regions C, of the metallization parts included in all of the excitation regions C.

Figure 9:
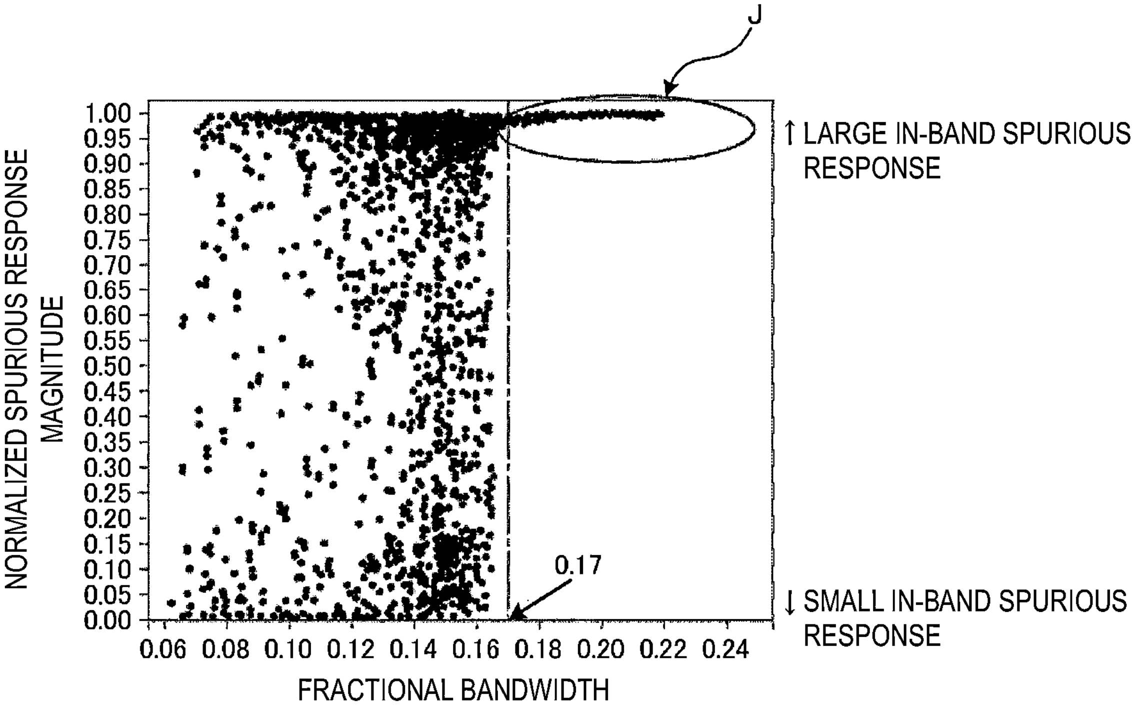
FIG. 9 illustrates the relationship between the fractional bandwidth of the surface acoustic wave device according to the first example embodiment of the present invention when a large number of surface acoustic wave resonators are provided, and the magnitude of the spurious response, represented by the phase rotation of the spurious impedance normalized to about 180 degrees.

FIG. 9 illustrates the relationship between the fractional bandwidth of the surface acoustic wave device according to the first example embodiment when a large number of surface acoustic wave resonators are provided, and the magnitude of the spurious response, represented by the phase rotation of the spurious impedance normalized to about 180 degrees. The fractional bandwidth is adjusted by varying, for example, the film thickness of the piezoelectric layer 2 and the respective dimensions of the electrode fingers 3 and 4. Although FIG. 9 illustrates the results for a case where the piezoelectric layer 2 made of Z-cut $LiNbO_3$ is used, the same or similar tendency is observed as well for cases where the piezoelectric layer 2 with another cut-angle is used.

The region bounded by an ellipse J in FIG. 9 exhibits a large spurious response of about 1.0. As appreciated from FIG. 9, at fractional bandwidths above about 0.17, that is, above about 17%, a large spurious response with a spurious level of about 1 or greater appears within the pass band even if parameters constituting the fractional bandwidth are varied. That is, as with the resonance characteristics illustrated in FIG. 8, a large spurious response indicated by the arrow B appears within the band. Thus, the fractional bandwidth is, for example, preferably less than or equal to about 17%. In this case, the spurious response can be reduced by adjusting, for example, the film thickness of the piezoelectric layer 2 or the respective dimensions of the electrode fingers 3 and 4.

Figure 10:
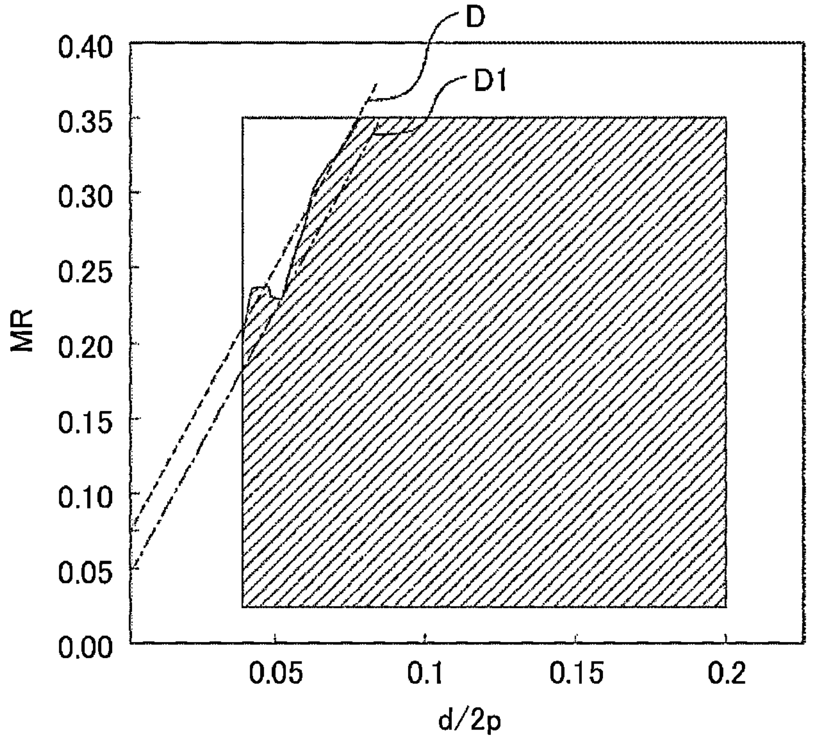
FIG. 10 illustrates the relationship between d/2p, metallization ratio MR, and fractional bandwidth.

FIG. 10 illustrates the relationship between d/2p, metallization ratio MR, and fractional bandwidth. As the acoustic wave device 1 according to the first example embodiment, acoustic wave devices 1 with different values of d/2p and MR are formed, and their fractional bandwidths are measured. The hatched region on the right-hand side of a broken line D in FIG. 10 represents a region with a fractional bandwidth of less than or equal to about 17%. The boundary between the hatched region and a non-hatched region is represented as MR=about 3.5(d/2p)+0.075. That is, MR=about 1.75(d/p)+0.075. Accordingly, for example, it is preferable that MR≤about 1.75(d/p)+0.075. In that case, a fractional bandwidth of less than or equal to about 178 can be easily obtained. A more preferable example of the region is the region on the right-hand side of a dash-dot line D1 in FIG. 10 that represents MR=about 3.5(d/2p)+0.05. In other words above-mentioned, if MR≤about 1.75(d/p)+0.05, this makes it possible to reliably achieve a fractional bandwidth of less than or equal to about 17%.

Figure 11:
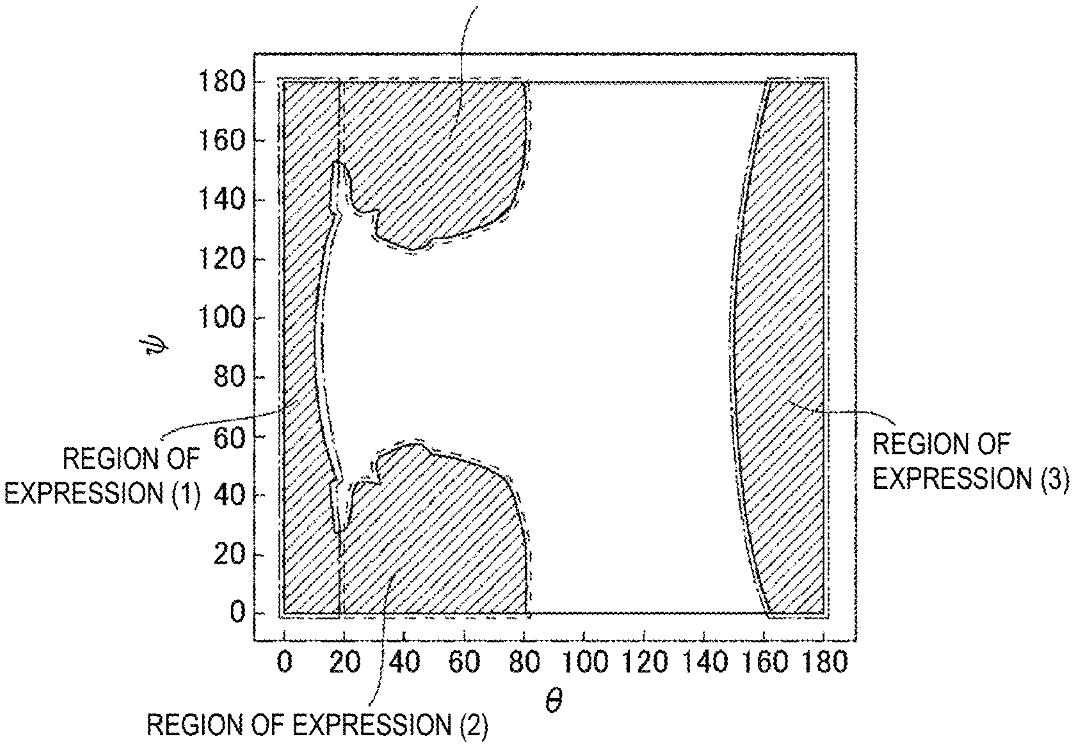
FIG. 11 illustrates a map of fractional bandwidth with respect to the Euler angles (0°, θ, ψ) of $LiNbO_3$ with d/p set as close to zero as possible.

FIG. 11 illustrates a map of fractional bandwidth with respect to the Euler angles (0°, θ, ψ) of $LiNbO_3$ with d/p set as close to zero as possible. Hatched regions in FIG. 11 represent regions where a fractional bandwidth of at least greater than or equal to about 5% is obtained. The ranges of individual regions are approximated by Expressions (1), (2), and (3) below.

$$(0° \pm 10°, 0° \text{ to } 20°, \text{any } \psi) \tag{1}$$

$$(0° \pm 10°, 20° \text{ to } 80°, 0° \text{ to } 60°(1-(\theta-50)^2/900)^{1/2}) \text{ or} \tag{2}$$

$$(0° \pm 10°, 20° \text{ to } 80°, \{180° - 60°(1-(\theta-50)^2/900)^{1/2}\} \text{ to } 180°)$$

$$(0° \pm 10°, \{180° - 30°(1-(\psi-90)^2/8100)^{1/2}\} \text{ to } 180°, \text{any } \psi) \tag{3}$$

Therefore, Euler angles within the range represented by Expression (1), (2), or (3) are preferred from the viewpoint of achieving a sufficiently large fractional bandwidth.

Figure 12:
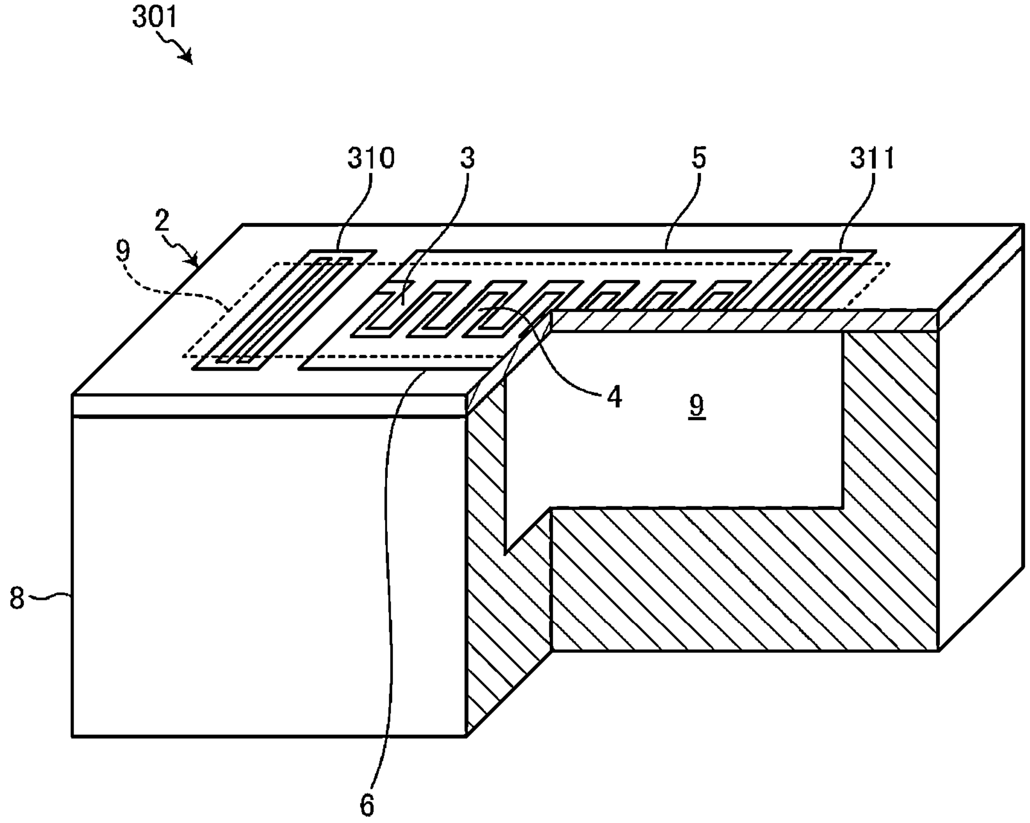
FIG. 12 is a partially cutaway perspective view of an acoustic wave device according to an example embodiment of the present invention.

FIG. 12 is a partially cutaway perspective view of an acoustic wave device according to an example embodiment of the present invention. In FIG. 12, the peripheral edges of the air gap 9 are represented by broken lines. The acoustic wave device according to the present invention may utilize plate waves. In this case, as illustrated in FIG. 12, an acoustic wave device 301 includes reflectors 310 and 311. The reflectors 310 and 311 are disposed at opposite sides of a region on the piezoelectric layer 2 where the electrode fingers 3 and 4 are present. In the acoustic wave device 301, Lamb waves, which are plate waves, are excited through application of an alternating-current electric field to the electrode fingers 3 and 4 disposed over the air gap 9. The presence of the reflectors 310 and 311 at opposite sides makes it possible to provide resonance characteristics due to Lamb waves, which are plate waves.

As described above, the acoustic wave device 1, 101 utilizes bulk waves in first-order thickness shear mode. The acoustic wave device 1, 101 is designed such that the first electrode finger 3 and the second electrode finger 4 are mutually adjacent electrodes, and d/p is, for example, less than or equal to about 0.5, where d is the thickness of the piezoelectric layer 2, and p is the center-to-center distance between the first electrode finger 3 and the second electrode finger 4. This allows for improved Q-factor even if the acoustic wave device is miniaturized.

In the acoustic wave device 1, 101, the piezoelectric layer 2 is made of, for example, lithium niobate or lithium tantalate. The first electrode finger 3 and the second electrode finger 4, which surface each other in the direction crossing the thickness direction of the piezoelectric layer 2, are disposed on the first major surface 2*a* or the second major surface 2*b* of the piezoelectric layer 2, and the first electrode finger 3 and the second electrode finger 4 are preferably covered from above by a protective film.

Figure 13:
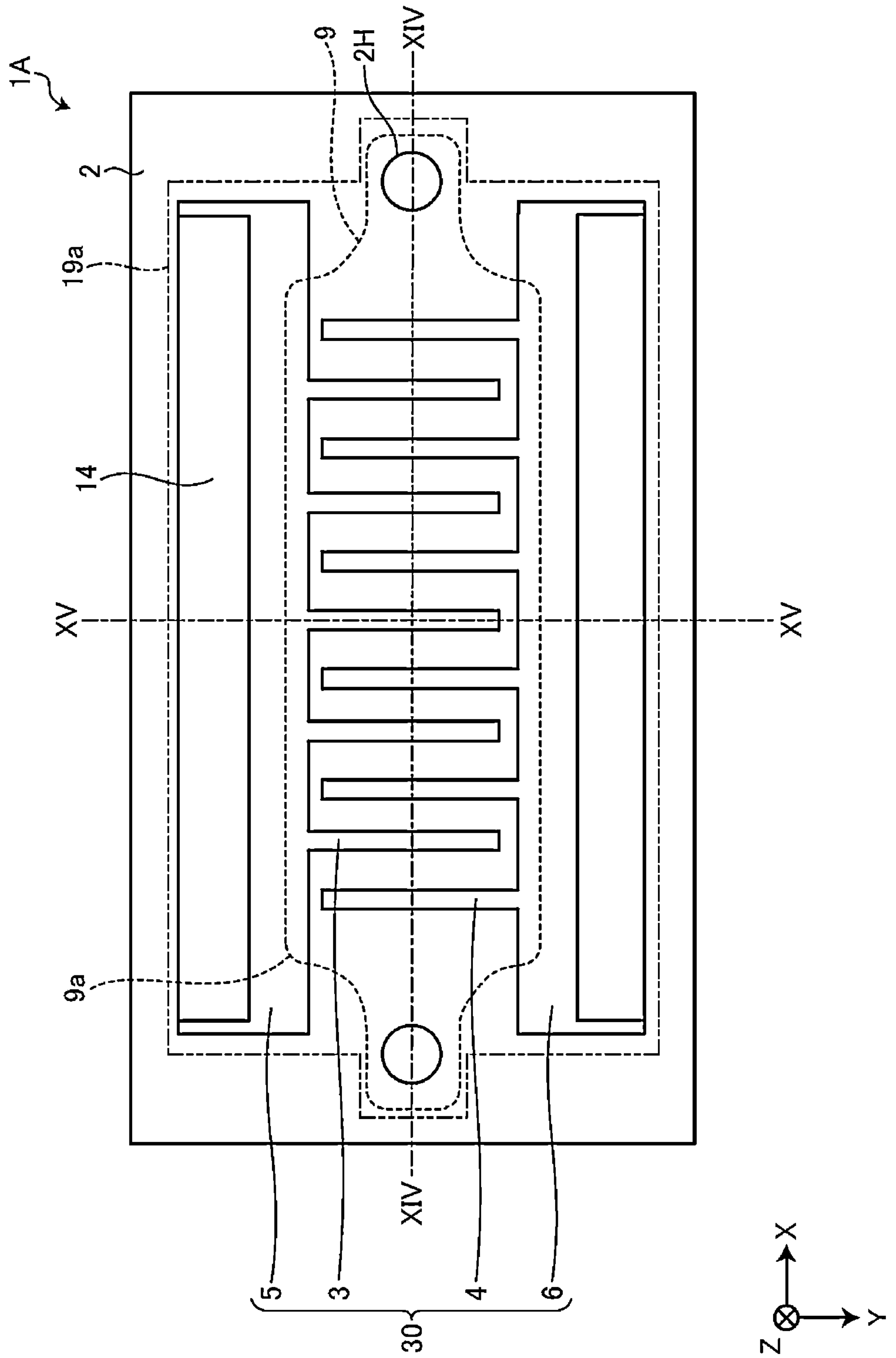
FIG. 13 is a schematic plan view of an example of the acoustic wave device according to the first example embodiment of the present invention.
Figure 14:
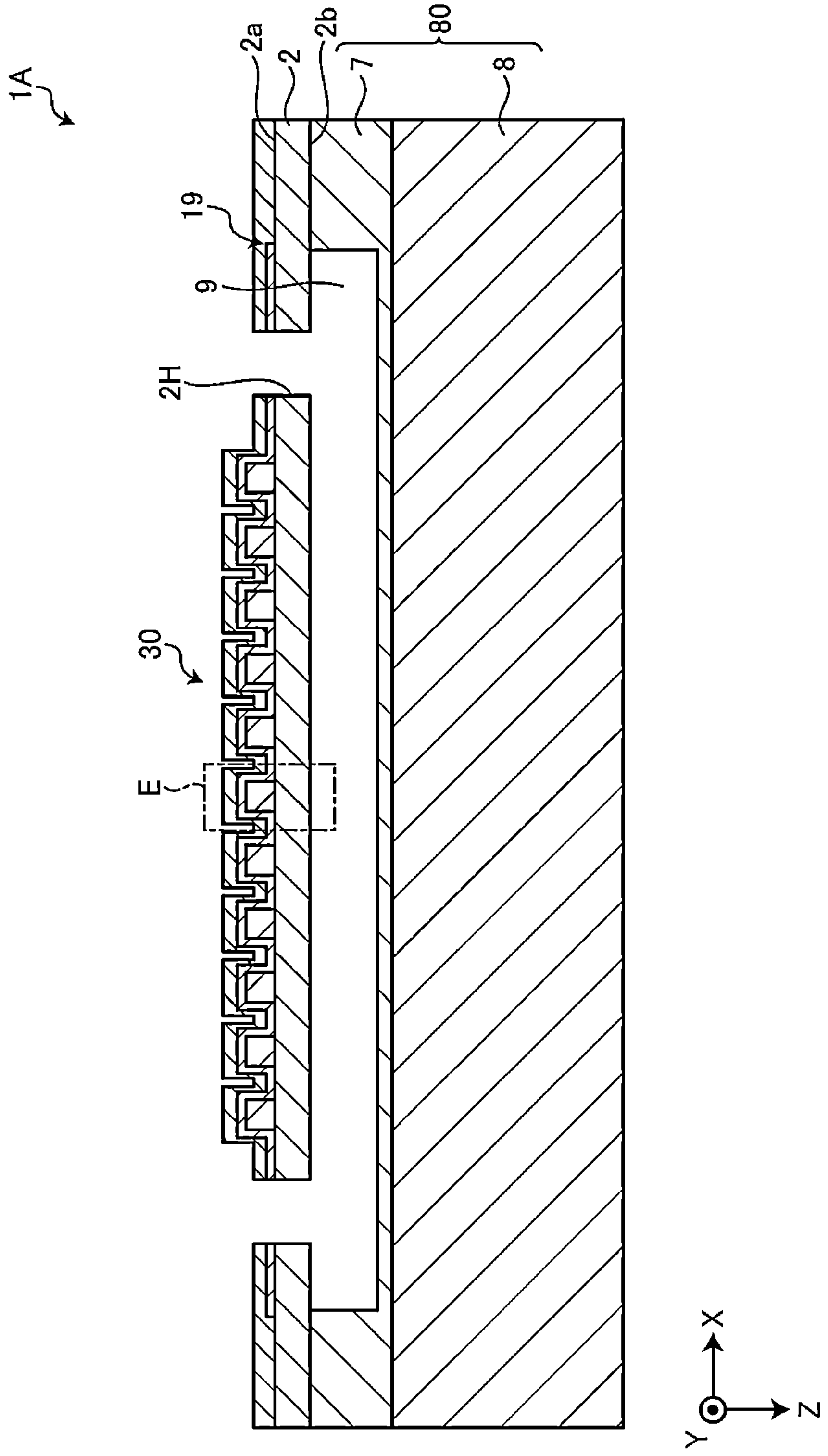
FIG. 14 is a cross-sectional view taken along a line XIV-XIV in FIG. 13.
Figure 15:
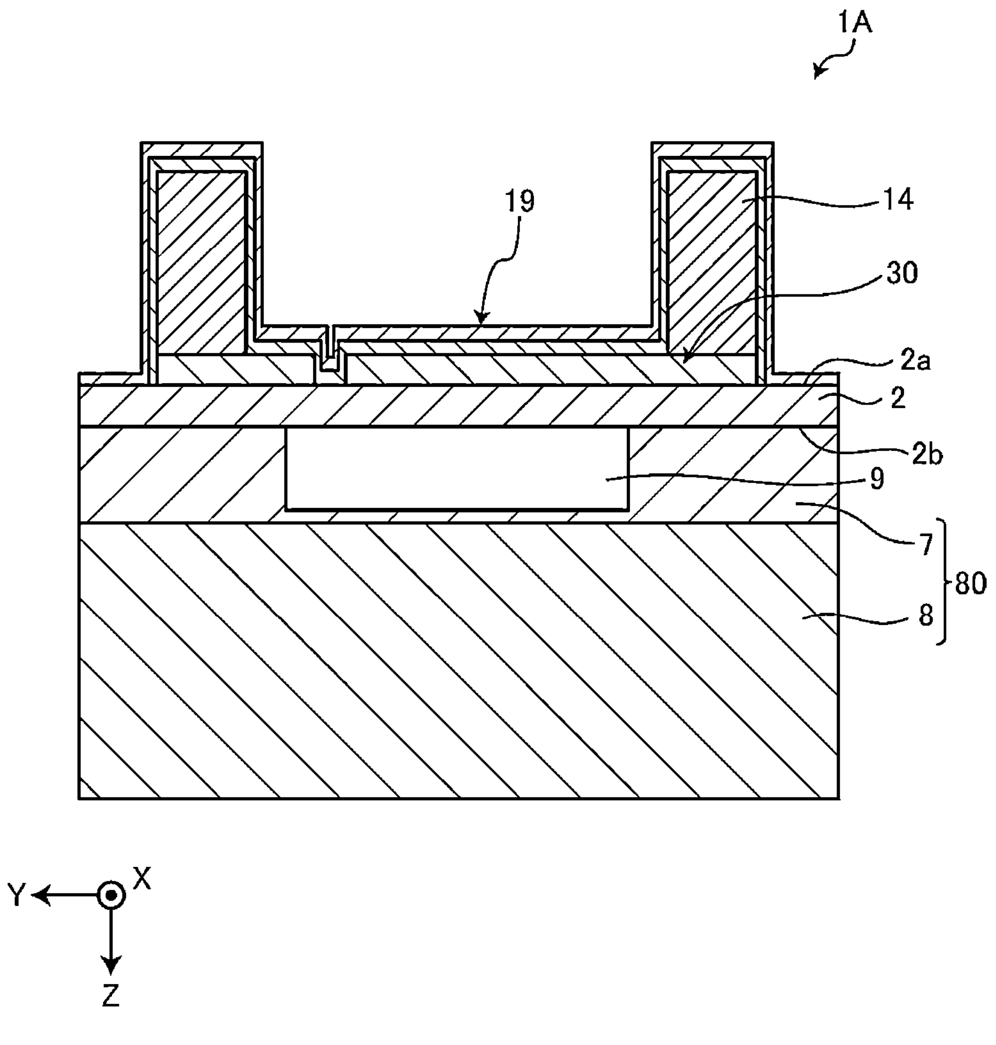
FIG. 15 is a cross-sectional view taken along a line XV-XV in FIG. 13.
Figure 16:
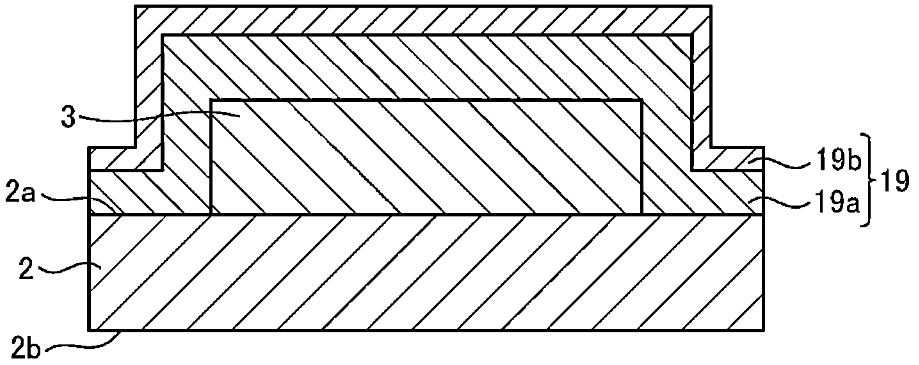
FIG. 16 is an enlarged cross-sectional view of a region E illustrated in FIG. 14.

FIG. 13 is a schematic plan view of an example of the acoustic wave device according to the first example embodiment. FIG. 14 is a cross-sectional view taken along a line XIV-XIV in FIG. 13. FIG. 15 is a cross-sectional view taken along a line XV-XV in FIG. 13. FIG. 16 is an enlarged cross-sectional view of a region E illustrated in FIG. 14. In FIG. 13, a protective film 19 is omitted from the illustration, and an area where a first-component insulative film 19*a* described later exists is indicated by a dash-dot-dot line. As illustrated in FIGS. 13 to 15, an acoustic wave device 1A according to the first example embodiment includes a support 80, the piezoelectric layer 2, a functional electrode 30, a wiring electrode 14, and the protective film 19.

The support 80 includes the support substrate 8. According to the first example embodiment, the support 80 includes the intermediate layer 7 and the support substrate 8. The intermediate layer 7 is disposed on a side of the support substrate 8 near the piezoelectric layer 2 in the Z-direction.

The support 80 includes the air gap 9. The air gap 9 is a space that is open at a side of the support 80 near the piezoelectric layer 2. According to the first example embodiment, the air gap 9 is located in the intermediate layer 7. In the example illustrated in FIGS. 14 and 15, the air gap 9 is located at a side of the intermediate layer 7 near the piezoelectric layer in the Z-direction. That is, it can be said that the air gap 9 is a space located between the piezoelectric layer 2 and the support substrate 8. The air gap 9 may be a space that extends through the intermediate layer 7 in the Z-direction.

As illustrated in FIG. 13, according to the first example embodiment, the air gap 9 includes edges with a shape such that opposite sides of a rectangle in the X-direction project outward in the X-direction. In plan view seen in the Z-direction, an edge of the air gap 9 refers to the boundary between a region that overlaps the air gap 9 and a region that does not overlap the air gap 9. In the example in FIG. 13, opposite edges of the air gap 9 in the Y-direction are two straight lines extending in the X-direction, and opposite edges of the air gap 9 in the X-direction have a shape that projects outward in the X-direction. In the following description, the portion of the air gap 9 that projects outward in the X-direction is referred to as extended portion.

The piezoelectric layer 2 is disposed on a side of the support 80 near the air gap 9 in the Z-direction. According to the first example embodiment, the piezoelectric layer 2 is disposed on a side of the support 80 near the intermediate layer 7. In the following description, in some cases, a surface of the piezoelectric layer 2 near the support 80 is referred to as the second major surface 2*b*, and a surface of the piezoelectric layer 2 opposite from the second major surface 2*b* in the Z-direction is referred to as the first major surface 2*a*.

The piezoelectric layer 2 includes a through-hole 2H. The through-hole 2H is a hole that extends through the piezoelectric layer 2 in the Z-direction. The through-hole 2H is positioned such that in plan view seen in the Z-direction, the through-hole 2H does not overlap the functional electrode 30. According to the first example embodiment, the through-hole 2H is positioned such that in plan view seen in the Z-direction, the through-hole 2H overlaps neither the functional electrode 30 nor the wiring electrode 14, and overlaps the air gap 9. That is, the through-hole 2H communicates with the air gap 9. In the example in FIG. 13, the through-hole 2H is positioned such that in plan view seen in the Z-direction, the through-hole 2H overlaps the extended portion of the air gap 9. The positioning of the through-hole 2H, however, is not limited to that described above. Alternatively, the through-hole 2H may be positioned in the Y-direction relative to the electrode fingers 3 and 4, such that the through-hole 2H is surrounded by the wiring electrode 14.

The functional electrode 30 is an IDT electrode having the electrode fingers 3 and 4, and the busbars 5 and 6. In the example in FIG. 13, the functional electrode 30 is disposed on the first major surface 2*a* of the piezoelectric layer 2. The functional electrode 30 corresponds to an example of a pair of electrodes. The term “pair of electrodes” refers to a set of electrodes including a first electrode and a second electrode that surface each other in a direction crossing the Z-direction, and that are disposed adjacent to each other on a major surface of the piezoelectric layer 2. When it is herein stated that the first electrode and the second electrode are adjacent to each other, this means that on the same major surface of the piezoelectric layer 2, no other electrode is present between the first electrode and the second electrode. According to the first example embodiment, the electrode finger 3 and the first busbar 5 correspond to the first electrode, and the electrode finger 4 and the second busbar 6 correspond to the second electrode. The number of functional electrodes 30 is not particularly limited. It may suffice that at least one functional electrode 30 be provided.

According to the first example embodiment, in plan view seen in the Z-direction, the busbars 5 and 6 are each positioned to overlap a corner 9*a* of the air gap 9. The corner 9*a* of the air gap 9 refers to one of the following points: the point of intersection between an edge of the air gap 9 located on each side in the X-direction and an edge of the air gap 9 located on each side in the Y-direction; and a point on an edge of the air gap 9 that is closest to the point of intersection between an extension of an edge of the air gap 9 located on each side in the X-direction and an extension of an edge of the air gap 9 located on each side in the Y-direction. That is, the corner 9*a* represents a point corresponding to the vertex of an edge of the air gap 9. The configuration described above makes it possible to mitigate concentration of stress on the piezoelectric layer 2, and consequently reduce the risk of cracking in the piezoelectric layer 2.

The wiring electrode 14 is disposed near the first major surface 2*a* of the piezoelectric layer 2. According to the first example embodiment, the wiring electrode 14 is a metallic layer made of, for example, an alloy of Al and Cu. The wiring electrode 14 is stacked over a portion of the busbars 5 and 6 of the functional electrode 30.

The protective film 19 is disposed over the functional electrode 30. In the example in FIG. 14, the protective film 19 is disposed over the entire or substantially the entire first major surface 2*a* of the piezoelectric layer 2 so as to cover the functional electrode 30 and the wiring electrode 14. As illustrated in FIG. 16, the protective film 19 includes the first-component insulative film 19*a*, and a second-component insulative film 19*b*. The first-component insulative film 19*a* is made of a first component, and in contact with the functional electrode 30. The second-component insulative film 19*b* is made of a second component, and located at the surface layer of the protective film 19.

The first-component insulative film 19*a* is in contact with the functional electrode 30. The expression "in contact with the functional electrode 30" includes being in contact with a portion of the functional electrode 30. According to the first example embodiment, the first-component insulative film 19*a* is positioned to overlap the air gap 9 in plan view seen in the Z-direction. In the example in FIGS. 14 and 15, the first-component insulative film 19*a* is disposed so as to cover a side of each of the functional electrode 30 and the wiring electrode 14 that is a side opposite from the piezoelectric layer 2.

The second-component insulative film 19*b* is located at the surface layer of the protective film 19. That is, the second-component insulative film 19*b* is disposed so as to cover the first-component insulative film 19*a*. According to the first example embodiment, the second-component insulative film 19*b* is disposed over the entire or substantially the entire first major surface 2*a* of the piezoelectric layer 2 so as to cover the first-component insulative film 19*a*. In other words, in plan view seen in the Z-direction, the protective film 19 includes a portion including the first-component insulative film 19*a* and the second-component insulative film 19*b*, and a single-layer portion including only the second-component insulative film 19*b*. In the example in FIG. 14, in the single-layer portion including only the second-component insulative film 19*b*, the second-component insulative film 19*b* is in contact with the first major surface 2*a* of the piezoelectric layer 2. The first-component insulative film 19*a* is thus protected by the second-component insulative film 19*b* located at the surface layer.

The first-component insulative film 19*a* has a higher moisture resistance than the second-component insulative film 19*b*. That is, the first-component insulative film 19*a* is less likely to absorb moisture contained in the air than the second-component insulative film 19*b*. This makes it possible to reduce absorption of moisture contained in the air by the first-component insulative film 19*a* in contact with the electrode fingers 3 and 4, and consequently reduce fluctuations in frequency characteristics.

Whether moisture resistance is high or low can be determined as follows. First, the first-component insulative film 19*a* and the second-component insulative film 19*b* are, for example, made to absorb moisture by being left standing for about 100 hours in an atmosphere with a temperature of about 85° C. and a humidity of about 85%. Then, how much water each of the first-component insulative film 19*a* and the second-component insulative film 19*b* releases is measured through thermal desorption spectroscopy. At this time, if the amount of water released by the second-component insulative film 19*b* is greater than the amount of water released by the first-component insulative film 19*a*, then it can be said that the first-component insulative film 19*a* has a higher moisture resistance than the second-component insulative film 19*b*.

The second-component insulative film 19*b* has a higher plasma resistance than the first-component insulative film 19*a*. That is, the second-component insulative film 19*b* is less susceptible to oxidation upon exposure to plasma than the first-component insulative film 19*a*. This makes it possible to reduce the risk that the second-component insulative film 19*b* located at the surface layer may oxidize upon exposure to plasma during manufacture of the acoustic wave device. This in turn can lead to reduced fluctuations in frequency characteristics.

Whether plasma resistance is high or low can be determined as follows. First, the first-component insulative film 19*a* and the second-component insulative film 19*b* are exposed to plasma. The exposure to plasma is, for example, performed under a condition the same as or similar to the condition under which plasma ashing is performed to remove resists R1 and R2 at a through-hole forming step or etching step that will be described later. Then, the composition ratio of oxygen included in each of the first-component insulative film 19*a* and the second-component insulative film 19*b* is measured by, for example, the TEM-EDX method, the XPS method, or Rutherford backscattering spectrometry (RBS). At this time, if the second-component insulative film 19*b* exhibits a smaller increase in the composition ratio of oxygen relative to the level prior to exposure to plasma than the first-component insulative film 19*a*, then it can be said that the second-component insulative film 19*b* has a higher plasma resistance than the first-component insulative film 19*a*.

According to the first example embodiment, the second-component insulative film 19*b* is thinner than the first-component insulative film 19*a*. For example, the first-component insulative film 19*a* can be made to have a thickness of about 15 nm, and the second-component insulative film 19*b* can be made to have a thickness of 5 nm. This makes it possible to protect the first-component insulative film 19*a* from plasma during manufacture of the acoustic wave device 1A while reducing fluctuations in frequency characteristics that occur due to absorption of moisture by the second-component insulative film 19*b*. If the acoustic wave device 1A includes a plurality of functional electrodes 30, the thickness of the first-component insulative film 19*a* may be varied for each functional electrode 30 with which the first-component insulative film 19*a* is in contact.

According to the first example embodiment, for example, the first-component insulative film 19*a* is a silicon nitride (SiN) film, and the second-component insulative film 19*b* is a silicon oxynitride (SiON) film. The configuration described above allows the first-component insulative film 19*a* to have a higher moisture resistance than the second-component insulative film 19*b*, and allows the second-component insulative film 19*b* to have a higher plasma resistance than the first-component insulative film 19$a$. As a result, fluctuations in frequency characteristics can be reduced.

Although the acoustic wave device 1A according to the first example embodiment has been described above, the acoustic wave device according to the first example embodiment is not limited to that described above.

For example, the combination of the material of the first-component insulative film 19$a$ and the material of the second-component insulative film 19$b$ is not limited to the combination described above. As used herein, the oxygen content of an insulative film refers to the composition ratio of oxygen included in the insulative film.

In an acoustic wave device according to a first modification of an example embodiment of the present invention, for example, the first-component insulative film 19$a$ is a silicon nitride (SiN) film, and the second-component insulative film 19$b$ is a silicon oxide ($SiO_2$) film. This configuration also allows the first-component insulative film 19$a$ to have a higher moisture resistance than the second-component insulative film 19$b$, and allows the second-component insulative film 19$b$ to have a higher plasma resistance than the first-component insulative film 19$a$. As a result, fluctuations in frequency characteristics can be reduced.

In an acoustic wave device according to a second modification of an example embodiment of the present invention, for example, the first-component insulative film 19$a$ and the second-component insulative film 19$b$ are each a silicon oxynitride (SiON) film. In this case, the second-component insulative film 19$b$ has a higher oxygen content than the first-component insulative film 19$a$. This configuration also allows the first-component insulative film 19$a$ to have a higher moisture resistance than the second-component insulative film 19$b$, and allows the second-component insulative film 19$b$ to have a higher plasma resistance than the first-component insulative film 19$a$. As a result, fluctuations in frequency characteristics can be reduced.

In an acoustic wave device according to a third modification of an example embodiment of the present invention, for example, the first-component insulative film 19$a$ is a silicon oxynitride (SiON) film, and the second-component insulative film 19$b$ is a silicon oxide ($SiO_2$) film. This configuration also allows the first-component insulative film 19$a$ to have a higher moisture resistance than the second-component insulative film 19$b$, and allows the second-component insulative film 19$b$ to have a higher plasma resistance than the first-component insulative film 19$a$. As a result, fluctuations in frequency characteristics can be reduced.

In an acoustic wave device according to a fourth modification of an example embodiment of the present invention, for example, the first-component insulative film 19$a$ and the second-component insulative film 19$b$ are each an aluminum oxide ($Al_2O_3$) film. In this case, the second-component insulative film 19$b$ has a higher oxygen content than the first-component insulative film 19$a$. This configuration also allows the first-component insulative film 19$a$ to have a higher moisture resistance than the second-component insulative film 19$b$, and allows the second-component insulative film 19$b$ to have a higher plasma resistance than the first-component: insulative film 19$a$. As a result, fluctuations in frequency characteristics can be reduced.

In an acoustic wave device according to a fifth modification of an example embodiment of the present invention, for example, the first-component insulative film 19$a$ and the second-component insulative film 19$b$ are each a titanium oxide film ($TiO_2$) film. In this case, the second-component insulative film 19$b$ has a higher oxygen content than the first-component insulative film 19$a$. This configuration also allows the first-component insulative film 19$a$ to have a higher moisture resistance than the second-component insulative film 19$b$, and allows the second-component insulative film 19$b$ to have a higher plasma resistance than the first-component insulative film 19$a$. As a result, fluctuations in frequency characteristics can be reduced.

In an acoustic wave device according to a sixth modification of an example embodiment of the present invention, for example, the first-component insulative film 19$a$ and the second-component insulative film 19$b$ are each a tantalum oxide ($Ta_2O_5$) film. In this case, the second-component insulative film 19$b$ has a higher oxygen content than the first-component insulative film 19$a$. This configuration also allows the first-component insulative film 19$a$ to have a higher moisture resistance than the second-component insulative film 19$b$, and allows the second-component insulative film 19$b$ to have a higher plasma resistance than the first-component insulative film 19$a$. As a result, fluctuations in frequency characteristics can be reduced.

As described above, the acoustic wave device 1A according to the first example embodiment includes the piezoelectric layer 2, at least one pair of electrodes (the electrode fingers 3 and 4), and the protective film 19. The piezoelectric layer 2 includes the first major surface 2$a$ and the second major surface 2$b$ that are opposite from each other in the first direction. The at least one pair of electrodes are disposed on at least one of the first major surface 2$a$ or the second major surface 2$b$. The protective film 19 covers at least a portion of the pair of electrodes. The protective film 19 includes the first-component insulative film 19$a$ made of the first component and in contact with the pair of electrodes, and the second-component insulative film 19$b$ made of the second component and located at the surface layer of the protective film 19. The first-component insulative film 19$a$ has a higher moisture resistance than the second-component insulative film 19$b$. The second-component insulative film 19$b$ has a higher plasma resistance than the first-component insulative film 19$a$. The configuration described above makes it possible to reduce absorption of moisture contained in the air by the first-component insulative film 19$a$ in contact with the electrode fingers 3 and 4, and reduce the risk that the second-component insulative film 19$b$ located at the surface layer may oxidize upon exposure to plasma during manufacture of the acoustic wave device. This in turn can lead to reduced fluctuations in frequency characteristics.

In an example embodiment, for example, the first-component insulative film 19$a$ is a silicon nitride film, and the second-component insulative film 19$b$ is a silicon oxynitride film. This configuration allows the first-component insulative film 19$a$ to have a higher moisture resistance than the second-component insulative film 19$b$, and allows the second-component insulative film 19$b$ to have a higher plasma resistance than the first-component insulative film 19$a$. As a result, fluctuations in frequency characteristics can be reduced.

In an example embodiment, for example, the first-component insulative film 19$a$ is a silicon nitride film, and the second-component insulative film 19$b$ is a silicon oxide film. This configuration allows the first-component insulative film 19$a$ to have a higher moisture resistance than the second-component insulative film 19$b$, and allows the second-component insulative film 19$b$ to have a higher plasma resistance than the first-component insulative film 19$a$. As a result, fluctuations in frequency characteristics can be reduced.

In an example embodiment, for example, the first-component insulative film 19*a* and the second-component insulative film 19*b* are each a silicon oxynitride film, and the second-component insulative film 19*b* has a higher oxygen content than the first-component insulative film 19*a*. This configuration allows the first-component insulative film 19*a* to have a higher moisture resistance than the second-component insulative film 19*b*, and allows the second-component insulative film 19*b* to have a higher plasma resistance than the first-component insulative film 19*a*. As a result, fluctuations in frequency characteristics can be reduced.

In an example embodiment, for example, the first-component insulative film 19*a* is a silicon oxynitride film, and the second-component insulative film 19*b* is a silicon oxide film. This configuration allows the first-component insulative film 19*a* to have a higher moisture resistance than the second-component insulative film 19*b*, and allows the second-component insulative film 19*b* to have a higher plasma resistance than the first-component insulative film 19*a*. As a result, fluctuations in frequency characteristics can be reduced.

In an example embodiment, for example, the first-component insulative film 19*a* and the second-component insulative film 19*b* are each an aluminum oxide film, and the second-component insulative film 19*b* has a higher oxygen content than the first-component insulative film 19*a*. This configuration allows the first-component insulative film 19*a* to have a higher moisture resistance than the second-component insulative film 19*b*, and allows the second-component insulative film 19*b* to have a higher plasma resistance than the first-component insulative film 19*a*. As a result, fluctuations in frequency characteristics can be reduced.

In an example embodiment, for example, the first-component insulative film 19*a* and the second-component insulative film 19*b* are each a titanium oxide film, and the second-component insulative film 19*b* has a higher oxygen content than the first-component insulative film 19*a*. This configuration allows the first-component insulative film 19*a* to have a higher moisture resistance than the second-component insulative film 19*b*, and allows the second-component insulative film 19*b* to have a higher plasma resistance than the first-component insulative film 19*a*. As a result, fluctuations in frequency characteristics can be reduced.

In an example embodiment, for example, the first-component insulative film 19*a* and the second-component insulative film 19*b* are each a tantalum oxide film, and the second-component insulative film 19*b* has a higher oxygen content than the first-component insulative film 19*a*. This configuration allows the first-component insulative film 19*a* to have a higher moisture resistance than the second-component insulative film 19*b*, and allows the second-component insulative film 19*b* to have a higher plasma resistance than the first-component insulative film 19*a*. As a result, fluctuations in frequency characteristics can be reduced.

In an example embodiment, for example, the pair of electrodes define the IDT electrode. The IDT electrode includes the first busbar 5 and the second busbar 6, at least one first electrode finger 3, and at least one second electrode finger 4. The first busbar 5 and the second busbar 6 surface each other in the second direction that crosses the first direction. The at least one first electrode finger 3 is connected at the proximal end to the first busbar 5, and extends in the second direction. The at least one second electrode finger 4 is connected at the proximal end to the second busbar 6, and extends in the second direction. This configuration allows for improved resonance characteristics.

In an example embodiment, for example, the acoustic wave device further includes the support 80 including the support substrate 8. The first direction coincides with the direction of thickness of the support substrate 8, and the piezoelectric layer 2 is disposed at a side of the support 80 in the first direction. The support 80 includes the air gap 9 that is open at a side of the support 80 near the piezoelectric layer 2 in the first direction. As seen in plan view in the first direction, at least part of the pair of electrodes overlaps the air gap 9. This configuration allows for improved resonance characteristics.

In an example embodiment, the protective film 19 in a region overlapping the air gap 9 in the first direction includes the first-component insulative film 19*a* in contact with the pair of electrodes, and the second-component insulative film 19*b* located at the surface layer of the protective film 19. This configuration makes it possible to improve frequency characteristics through adjustment of the film thickness of the first-component insulative film 19*a*.

In an example embodiment, the protective film 19 includes a portion including the first-component insulative film 19*a* and the second-component insulative film 19*b*, and a portion including only the second-component insulative film 19*b*. The portion including the first-component insulative film 19*a* and the second-component insulative film 19*b* overlaps the air gap 9 in the first direction. The portion including only the second-component insulative film 19*b* is in direct contact with the piezoelectric layer 2. As a result, the first-component insulative film 19*a* is protected by the second-component insulative film 19*b* located at the surface layer. This makes it possible to protect the first-component insulative film 19*a* from plasma during manufacture of the acoustic wave device 1A. This in turn can result in reduced or prevented fluctuations in frequency characteristics.

In an example embodiment, the protective film 19 in a non-overlapping region not overlapping the air gap 9 in the first direction includes only the second-component insulative film 19*b*, and the second-component insulative film 19*b* in the non-overlapping region is in direct contact with the piezoelectric layer 2. As a result, the first-component insulative film 19*a* is protected by the second-component insulative film 19*b* located at the surface layer. This makes it possible to protect the first-component insulative film 19*a* from plasma during manufacture of the acoustic wave device 1A. This in turn can result in reduced or prevented fluctuations in frequency characteristics.

In an example embodiment, the pair of electrodes constitute the IDT electrode. The IDT electrode includes the first busbar 5 and the second busbar 6, at least one first electrode finger 3, and at least one second electrode finger 4. The first busbar 5 and the second busbar 6 face each other in the second direction that crosses the first direction. The at least one first electrode finger 3 is connected at the proximal end to the first busbar 5, and extends in the second direction. The at least one second electrode finger 4 is connected at the proximal end to the second busbar 6, and extends in the second direction. In plan view seen in the first direction, the first busbar 5 or the second busbar 6 is positioned to overlap the corner 9*a* of the air gap 9. This configuration makes it possible to mitigate concentration of stress on the piezoelectric layer 2, and consequently reduce the risk of cracking in the piezoelectric layer 2.

In an example embodiment, lithium niobate or lithium tantalate defining the piezoelectric layer has Euler angles ($\varphi$, $\theta$, $\psi$) within a range represented by Expression (1), Expression (2), or Expression (3) below. This makes it possible to reliably achieve a fractional bandwidth of less than or equal to about 17%.

$$(0° \pm 10°, 0° \text{ to } 20°, \text{any } \psi) \tag{1}$$

$$(0° \pm 10°, 20° \text{ to } 80°, 0° \text{ to } 60°(1-(\theta-50)^2/900)^{1/2}) \text{ or} \tag{2}$$

$$(0° \pm 10°, 20° \text{ to } 80°, [180° - 60°(1-(\theta-50)^2/900)^{1/2}] \text{ to } 180°)$$

$$(0° \pm 10°, [180° - 30°(1-(\psi-90)^2/8100)^{1/2}] \text{ to } 180°, \text{any } \psi) \tag{3}$$

In an example embodiment, the pair of electrodes define the IDT electrode. The IDT electrode includes the first busbar 5 and the second busbar 6, at least one first electrode finger 3, and at least one second electrode finger 4. The first busbar 5 and the second busbar 6 face each other in the second direction that crosses the first direction. The at least one first electrode finger 3 is connected at the proximal end to the first busbar 5, and extends in the second direction. The at least one second electrode finger 4 is connected at the proximal end to the second busbar 6, and extends in the second direction. The ratio d/p is less than or equal to about 0.5, where d is the film thickness of the piezoelectric layer 2, and p is the center-to-center distance between the first electrode finger 3 and the second electrode finger 4 that are adjacent to each other. This configuration makes it possible to effectively excite bulk waves in first-order thickness shear mode.

In an example embodiment, the ratio d/p is less than or equal to about 0.24. This configuration makes it possible to more effectively excite bulk waves in first-order thickness shear mode.

In an example embodiment, the pair of electrodes define the IDT electrode. The IDT electrode includes the first busbar 5 and the second busbar 6, at least one first electrode finger 3, and at least one second electrode finger 4. The first busbar 5 and the second busbar 6 face each other in the second direction that crosses the first direction. The at least one first electrode finger 3 is connected at the proximal end to the first busbar 5, and extends in the second direction. The at least one second electrode finger 4 is connected at the proximal end to the second busbar 6, and extends in the second direction. As seen in a direction in which the first electrode finger 3 and the second electrode finger 4 that are adjacent to each other surface each other, a region where the first electrode finger 3 and the second electrode finger 4 that are adjacent to each other overlap is an excitation region. The condition MR≤about 1.75(d/p)+0.075 is satisfied, where MR is the metallization ratio of the first electrode finger 3 and the second electrode finger 4 to the excitation region. This configuration allows for effective reduction of spurious response.

In an example embodiment, the acoustic wave device is operable to generate a bulk wave in thickness shear mode. This allows for improved coupling coefficient, and consequently makes it possible to provide the acoustic wave device with improved resonance characteristics.

In an example embodiment, the acoustic wave device is operable to generate a plate wave. This makes it possible to provide the acoustic wave device with improved resonance characteristics.

An example of a manufacturing method for the acoustic wave device according to the first example embodiment is described below. The manufacturing method for the acoustic wave device 1A according to the first example embodiment includes a sacrificial-layer forming step, an intermediate-layer forming step, a bonding step, a thinning step, an electrode forming step, a first-component insulative film forming step, a second-component insulative film forming step, a through-hole forming step, and an etching step.

Figure 17:
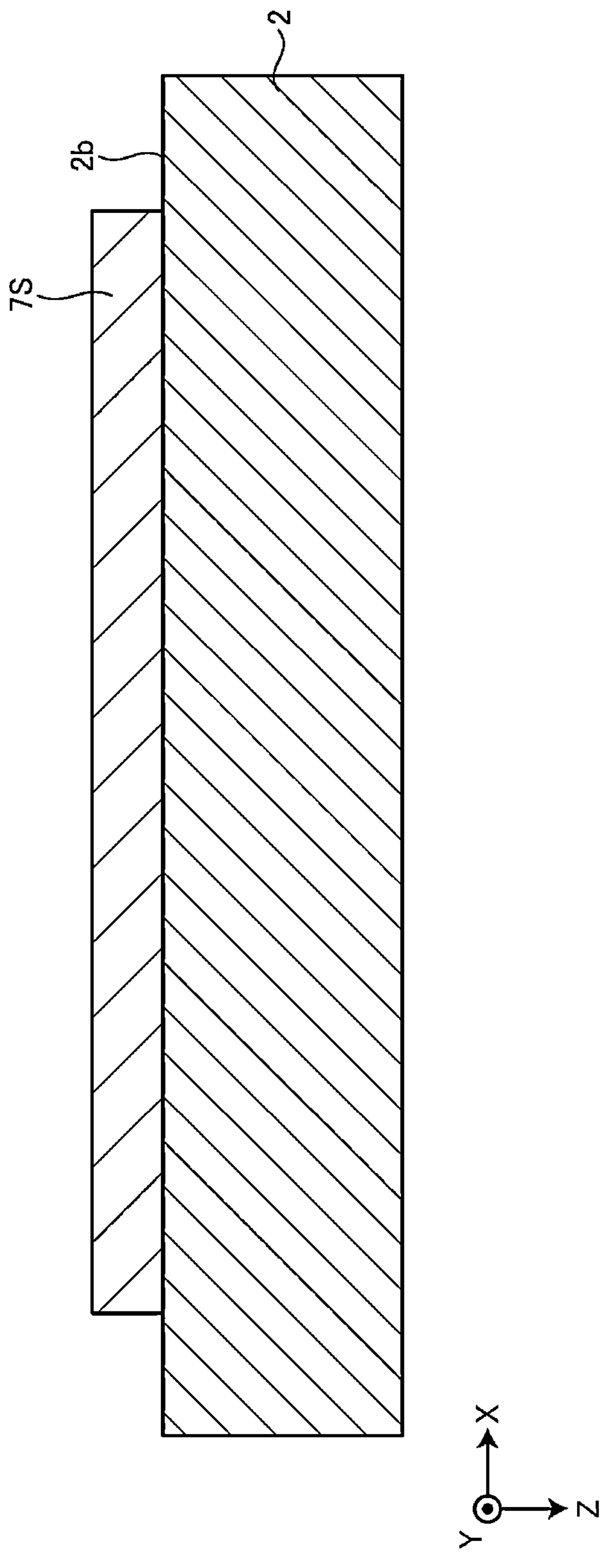
FIG. 17 illustrates, in schematic cross-sectional view, a sacrificial-layer forming step of an example of a method for manufacturing the acoustic wave device according to the first example embodiment of the present invention.

FIG. 17 illustrates, in schematic cross-sectional view, the sacrificial-layer forming step of the method for manufacturing the acoustic wave device according to the first example embodiment. As illustrated in FIG. 17, the sacrificial-layer forming step is the step of forming a sacrificial layer 7S on the second major surface 2*b* of the piezoelectric layer 2. The sacrificial layer 7S is formed by, for example, depositing the sacrificial layer 7S on the entire second major surface 2*b* of the piezoelectric layer 2, and then removing part of the sacrificial layer 7S on the piezoelectric layer 2 by patterning of a resist. The resist is removed after the sacrificial layer 7S is formed.

Figure 18:
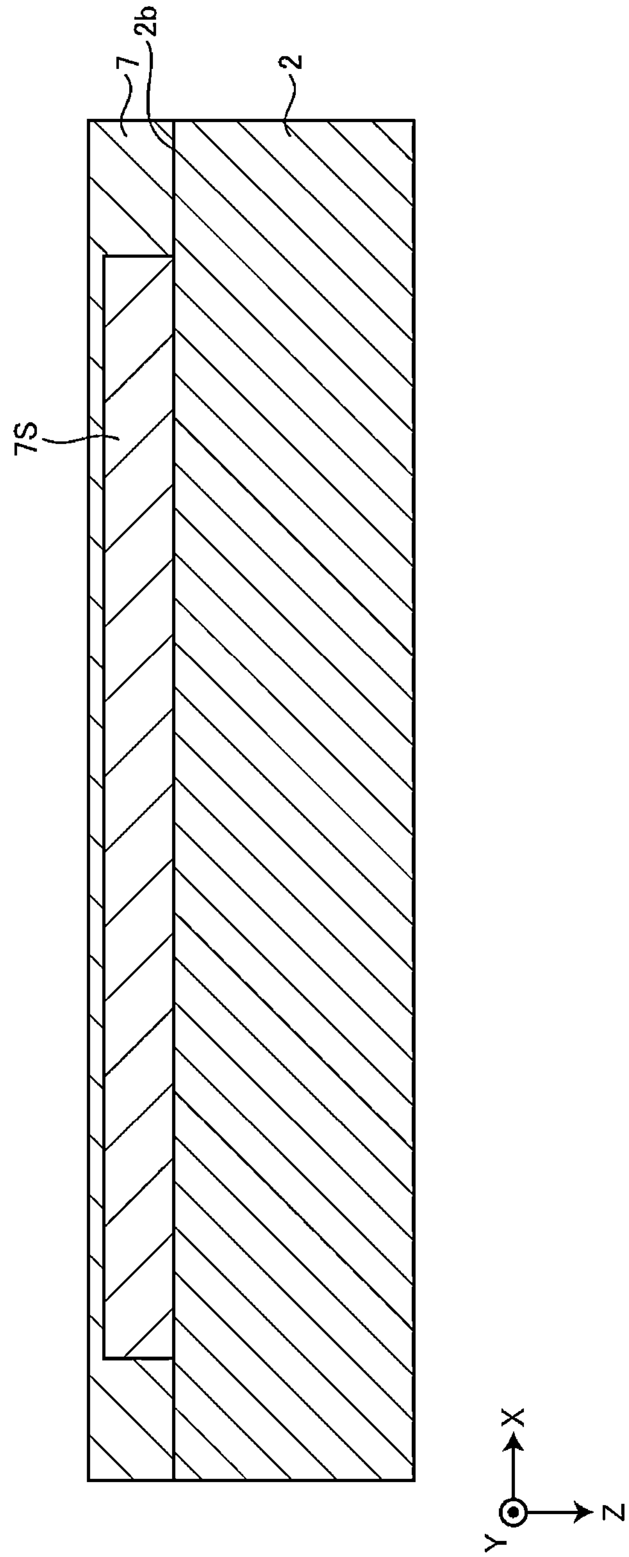
FIG. 18 illustrates, in schematic cross-sectional view, an intermediate-layer forming step of the example of the method for manufacturing the acoustic wave device according to the first example embodiment of the present invention.

FIG. 18 illustrates, in schematic cross-sectional view, the intermediate-layer forming step of the method for manufacturing the acoustic wave device according to the first example embodiment. As illustrated in FIG. 18, the intermediate-layer forming step is the step of forming the intermediate layer 7 on the second major surface 2*b* of the piezoelectric layer 2 so as to cover the sacrificial layer 7S. The intermediate layer 7 is formed by, for example, depositing the intermediate layer 7 on the second major surface 2*b* of the piezoelectric layer 2, and grinding a major surface of the intermediate layer 7 that is located opposite from the piezoelectric layer 2 in the Z-direction.

Figure 19:
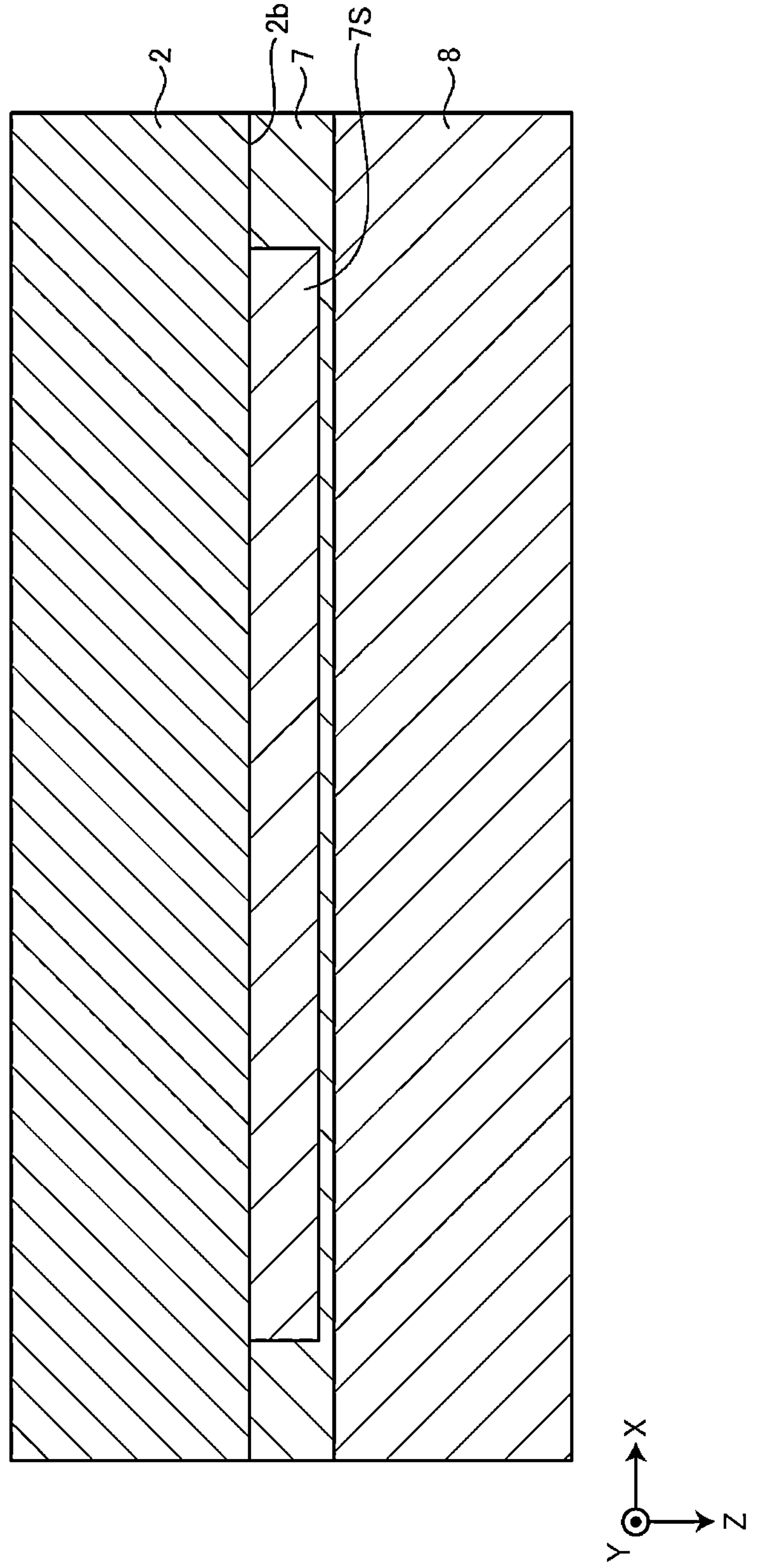
FIG. 19 illustrates, in schematic cross-sectional view, a bonding step of the example of the method for manufacturing the acoustic wave device according to the first example embodiment of the present invention.

FIG. 19 illustrates, in schematic cross-sectional view, the bonding step of the method for manufacturing the acoustic wave device according to the first example embodiment. As illustrated in FIG. 19, the bonding step is the step of bonding the support substrate 8 onto a side of the intermediate layer 7 that is located opposite from the piezoelectric layer 2 in the Z-direction. The support 80 including the intermediate layer 7 and the support substrate 8 is thus formed.

Figure 20:
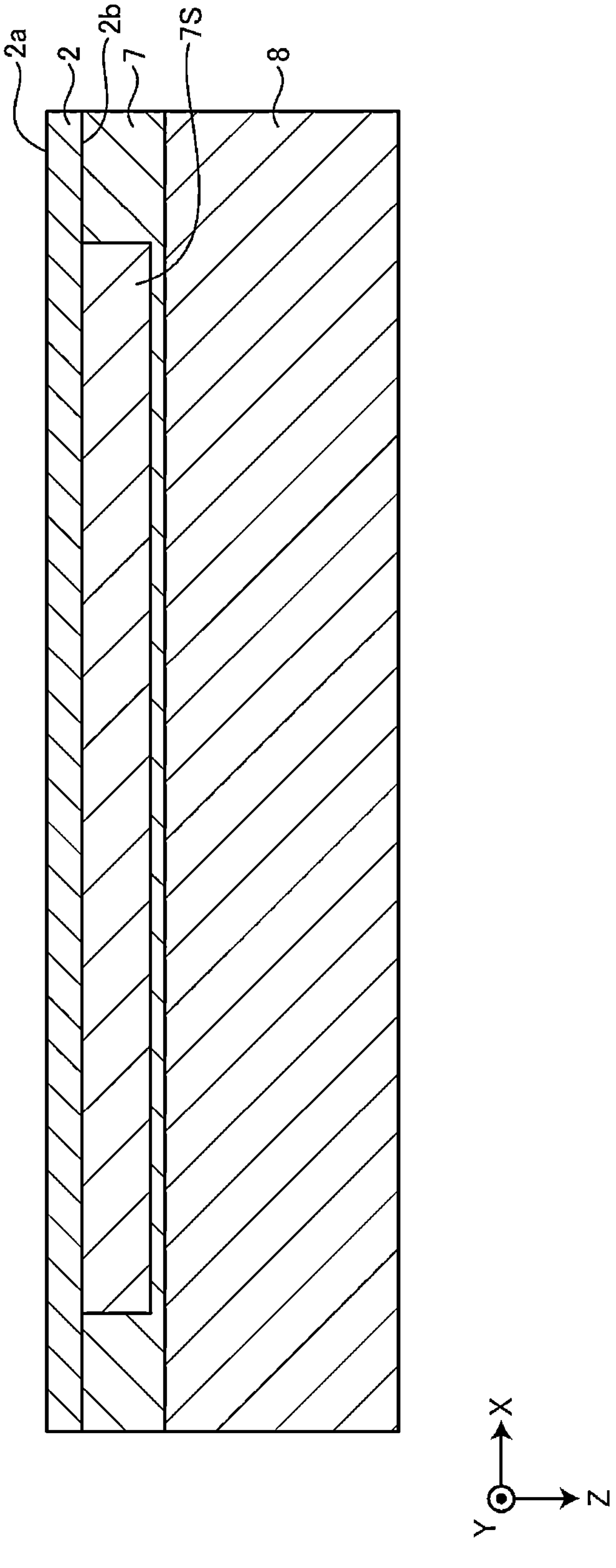
FIG. 20 illustrates, in schematic cross-sectional view, a thinning step of the example of the method for manufacturing the acoustic wave device according to the first example embodiment of the present invention.

FIG. 20 illustrates, in schematic cross-sectional view, the thinning step of the method for manufacturing the acoustic wave device according to the first example embodiment. As illustrated in FIG. 20, the thinning step is the step of thinning the piezoelectric layer 2 through grinding of the piezoelectric layer 2. The first major surface 2*a* of the piezoelectric layer 2 is thus formed.

Figure 21:
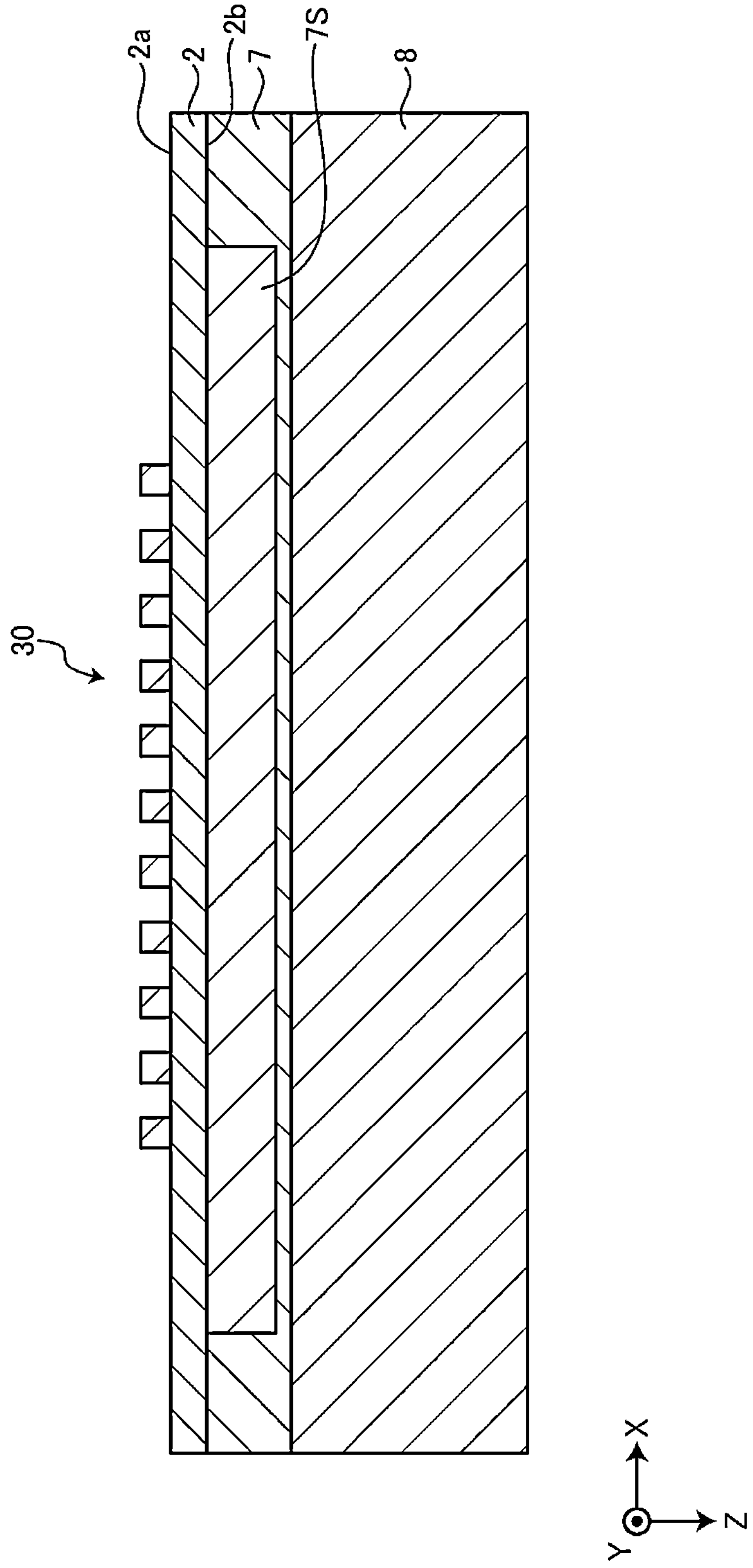
FIG. 21 illustrates, in schematic cross-sectional view, an electrode forming step of the example of the method for manufacturing the acoustic wave device according to the first example embodiment of the present invention.

FIG. 21 illustrates, in schematic cross-sectional view, the electrode forming step of the method for manufacturing the acoustic wave device according to the first example embodiment. As illustrated in FIG. 21, the electrode forming step is the step of forming the functional electrode 30 on the first major surface 2*a* of the piezoelectric layer 2. The functional electrode 30 is formed through, for example, the lift-off process. After the functional electrode 30 is formed, the wiring electrode 14 is disposed on the functional electrode 30.

Figure 22:
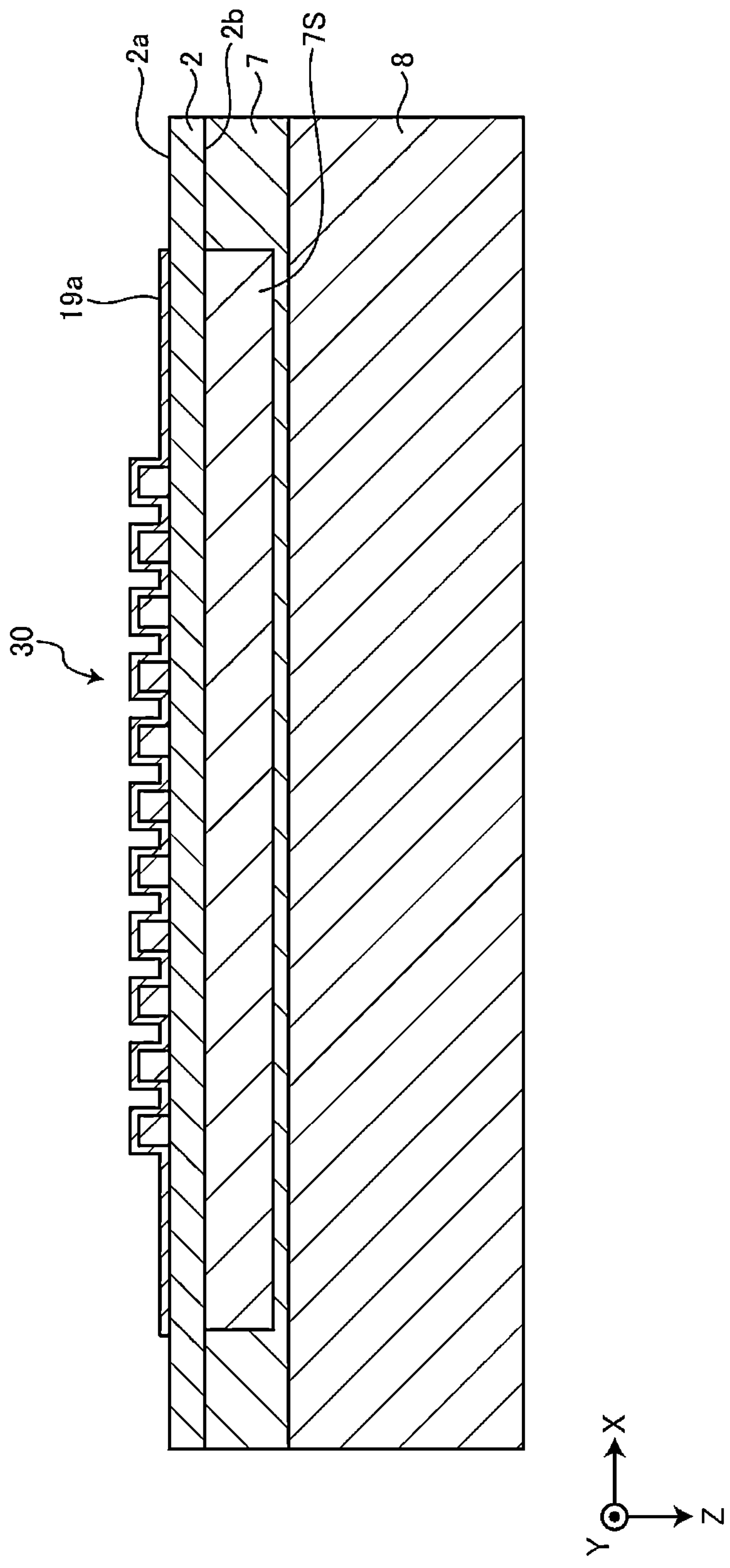
FIG. 22 illustrates, in schematic cross-sectional view, a first-component insulative film forming step of the example of the method for manufacturing the acoustic wave device according to the first example embodiment of the present invention.

FIG. 22 illustrates, in schematic cross-sectional view, the first-component insulative film forming step of the method for manufacturing the acoustic wave device according to the first example embodiment. As illustrated in FIG. 22, the first-component insulative film forming step is the step of forming the first-component insulative film 19*a* over the first major surface 2*a* of the piezoelectric layer 2 so as to cover the functional electrode 30. In the example in FIG. 22, the first-component insulative film 19*a* is positioned to overlap the air gap 9 in plan view seen in the Z-direction. After the first-component insulative film 19*a* is formed, the film thickness of the first-component insulative film 19*a* is adjusted so that the acoustic wave device 1A has desired frequency characteristics. Since the first-component insulative film 19*a* has a higher moisture resistance than the second-component insulative film 19*b* described later, absorption of moisture by the protective film 19 in the subsequent steps can be reduced. This can lead to reduced or prevented fluctuations in frequency characteristics.

Figure 23:
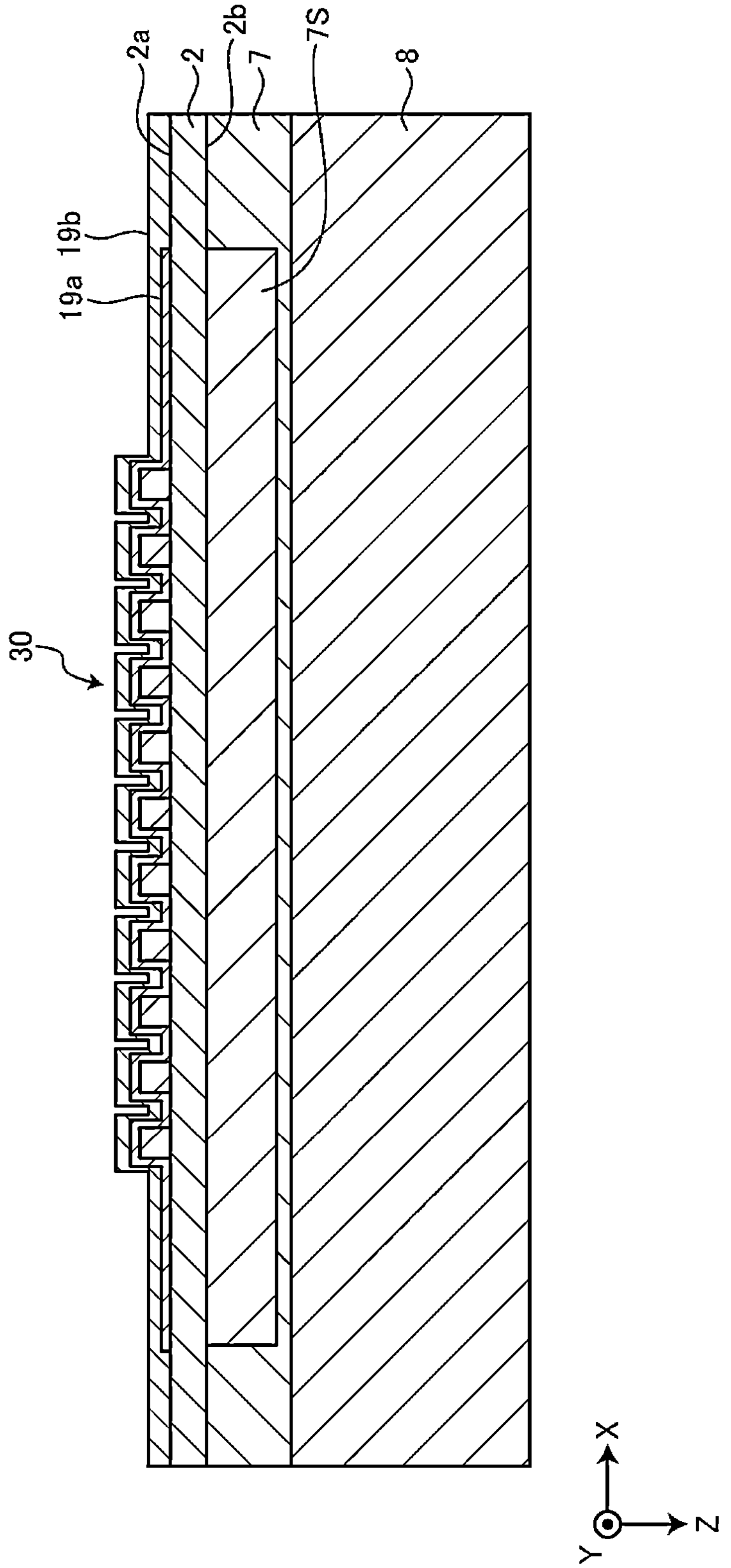
FIG. 23 illustrates, in schematic cross-sectional view, a second-component insulative film forming step of the example of the method for manufacturing the acoustic wave device according to the first example embodiment of the present invention.

FIG. 23 illustrates, in schematic cross-sectional view, the second-component insulative film forming step of the method for manufacturing the acoustic wave device according to the first example embodiment. As illustrated in FIG. 23, the second-component insulative film forming step is the step of forming the second-component insulative film 19*b* over the first major surface 2*a* of the piezoelectric layer 2 so as to cover the first-component insulative film 19*a*. In the example in FIG. 23, the second-component insulative film 19*b* is disposed over the entire or substantially the entire first major surface 2*a* of the piezoelectric layer 2. As a result, the first-component insulative film 19*a* made of the first component is protected by the second-component insulative film 19*b*.

Figure 24:
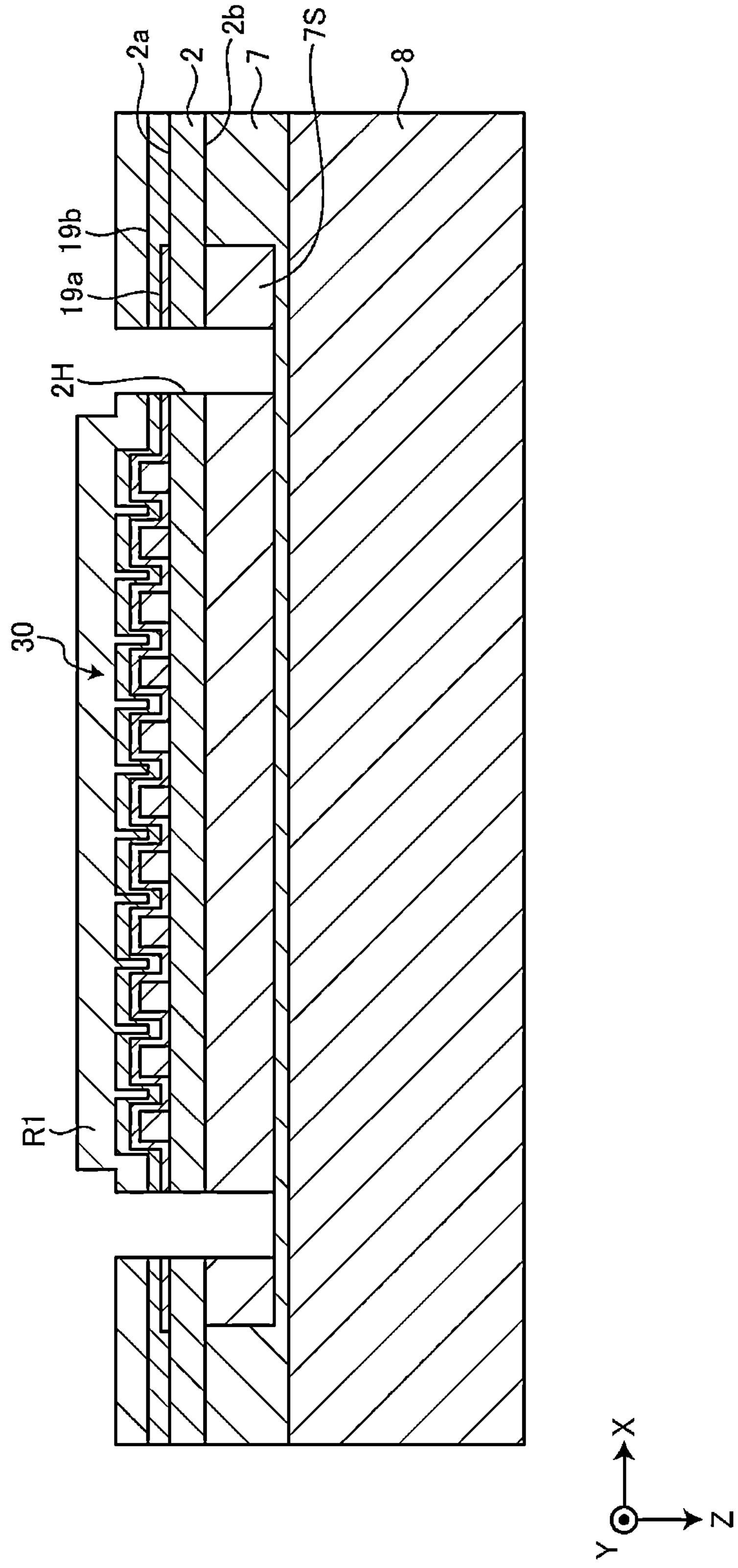
FIG. 24 illustrates, in schematic cross-sectional view, a through-hole forming step of the example of the method for manufacturing the acoustic wave device according to the first example embodiment of the present invention.

FIG. 24 illustrates, in schematic cross-sectional view, the through-hole forming step of the method for manufacturing the acoustic wave device according to the first example embodiment. As illustrated in FIG. 24, the through-hole forming step is the step of forming the through-hole 2H in the piezoelectric layer 2. The through-hole 2H is formed by forming a resist R1 over the first major surface 2*a* of the piezoelectric layer 2, and removing a portion of the piezoelectric layer 2. The resist R1 is removed by plasma ashing after the through-hole 2H is formed. At this time, due to the presence of the second-component insulative film 19*b* having a higher plasma resistance than the first-component f insulative film 19*a*, oxidation of the protective film 19 during the plasma ashing can be reduced. This can lead to reduced or prevented fluctuations in frequency characteristics.

Figure 25:
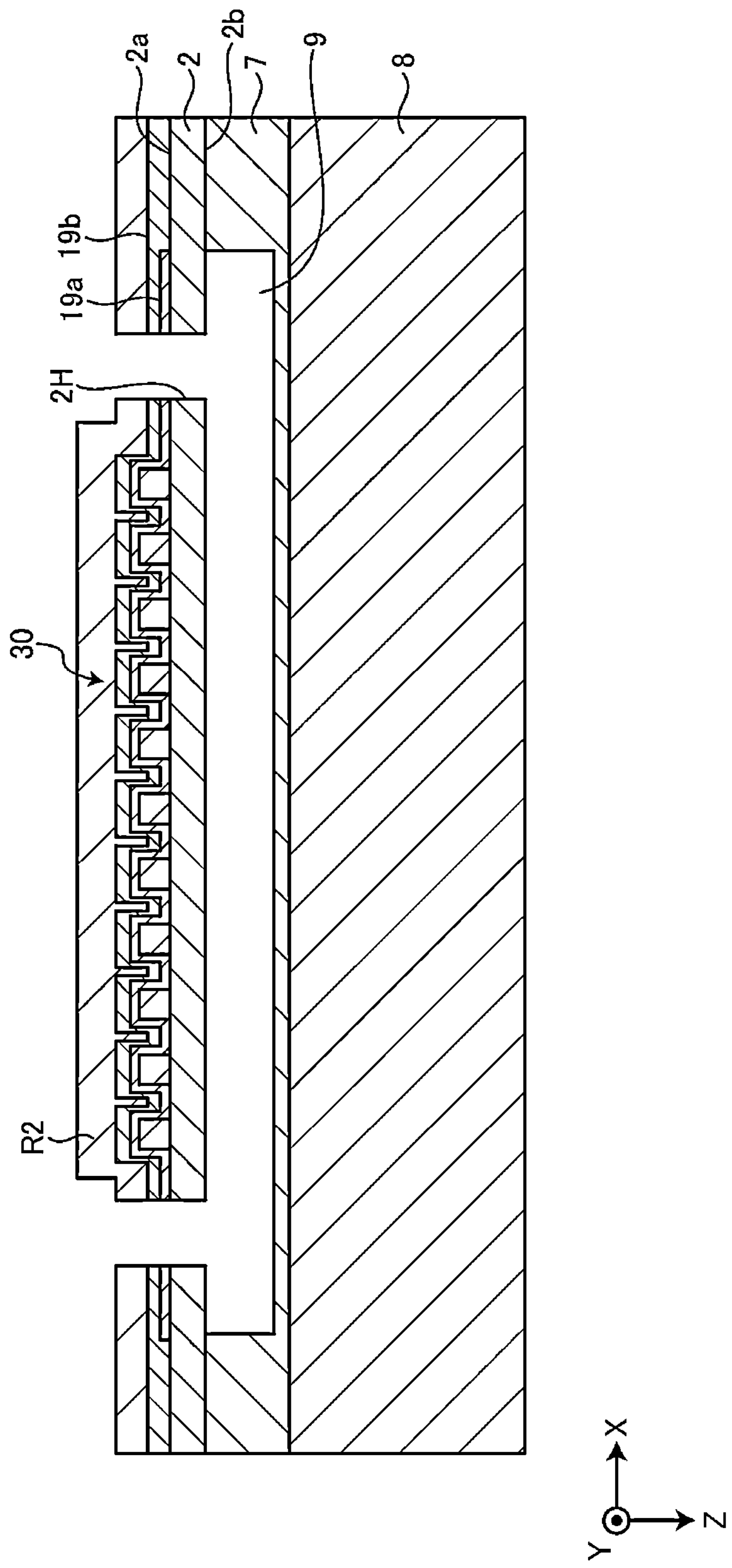
FIG. 25 illustrates, in schematic cross-sectional view, an etching step of the example of the method for manufacturing the acoustic wave device according to the first example embodiment of the present invention.

FIG. 25 illustrates, in schematic cross-sectional view, the etching step of the method for manufacturing the acoustic wave device according to the first example embodiment. As illustrated in FIG. 25, the etching step is the step of etching away the sacrificial layer 7S to thus form the air gap 9. The sacrificial layer 7S is removed by forming a resist R2 over the first major surface 2*a* of the piezoelectric layer 2, and injecting an etchant from the through-hole 2H to thereby remove the sacrificial layer 7S. The resist R2 is removed by plasma ashing after the sacrificial layer 7S is etched away. At this time, due to the presence of the second-component insulative film 19*b* having a higher plasma resistance than the first-component insulative film 19*a*, oxidation of the protective film 19 during the plasma ashing can be reduced. This can lead to reduced or prevented fluctuations in frequency characteristics.

The acoustic wave device 1A according to the first example embodiment can be manufactured, for example, through the steps described above. The method for manufacturing the acoustic wave device 1A described above is an example, and not intended to be limiting.

For example, in order for the acoustic wave device 1A to have desired frequency characteristics, instead of adjusting the film thickness of the first-component insulative film 19*a* after the first-component insulative film 19*a* is formed, the film thickness of the second-component film 19*b* may be adjusted after the second-component insulative film 19*b* is formed.

Second Example Embodiment

Figure 26:
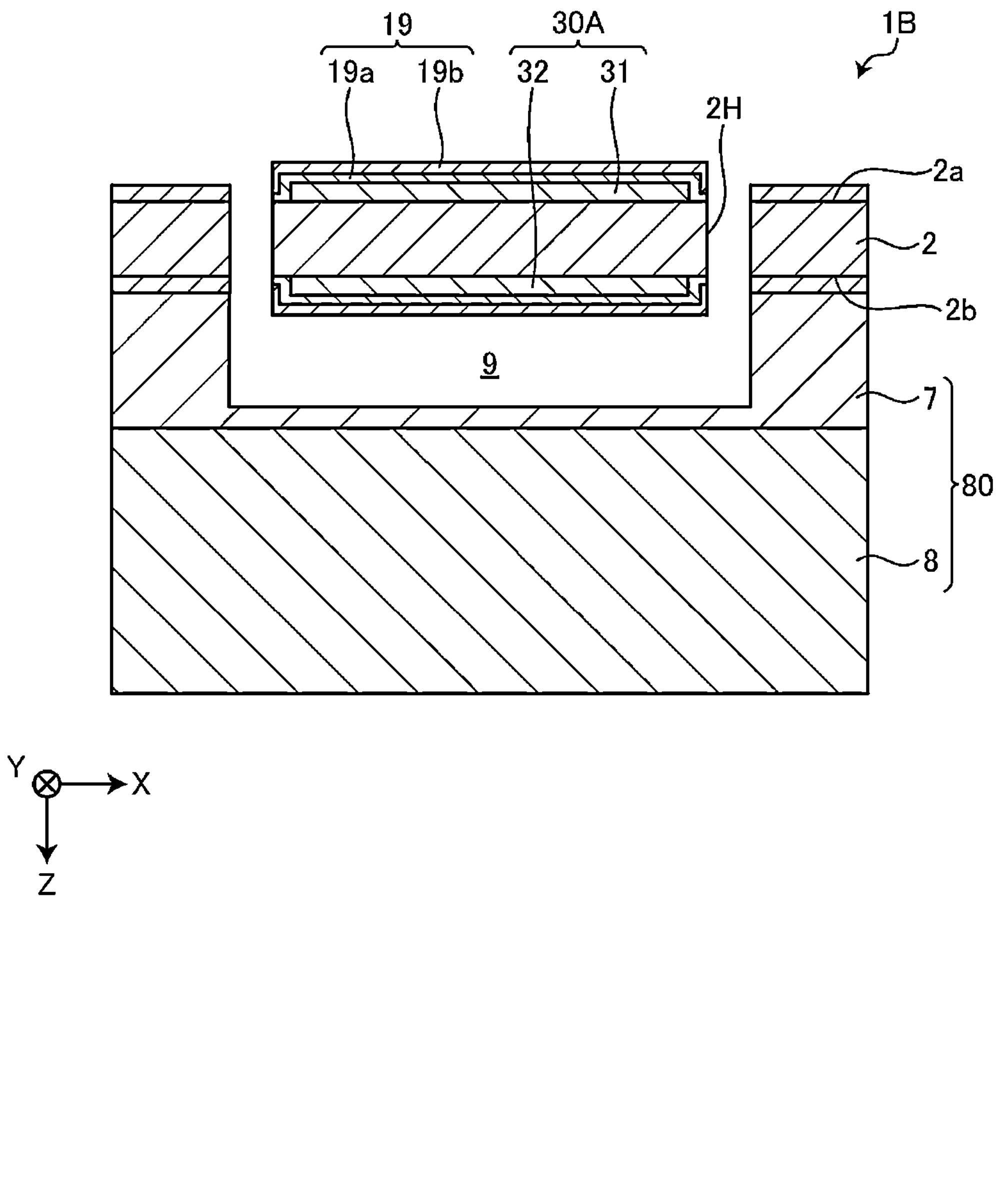
FIG. 26 is a schematic cross-sectional view of an example of an acoustic wave device according to a second example embodiment of the present invention.

FIG. 26 is a schematic cross-sectional view of an example of an acoustic wave device according to a second example embodiment of the present invention. The second example embodiment differs from the first example embodiment in that an acoustic wave device 1B according to the second example embodiment is a device that utilizes bulk waves, that is, a bulk acoustic wave (BAW) device. As illustrated in FIG. 26, according to the second example embodiment, a functional electrode 30A includes a first electrode 31, and a second electrode 32. The first electrode 31 is an electrode disposed on the first major surface 2*a*, and is also referred to as upper electrode. The second electrode 32 is an electrode disposed on the second major surface 2*b*, and is also referred to as lower electrode. In the present example in FIG. 26, the protective film 19 is disposed over the entire or substantially the entire first major surface 2*a* of the piezoelectric layer 2 and the entire or substantially the entire second major surface 2*b* of the piezoelectric layer 2, such that the protective film 19 covers the functional electrode 30 and the wiring electrode (not illustrated). The protective film 19 may be disposed over one of the first major surface 2*a* or the second major surface 2*b*. The protective film 19 disposed over the first major surface 2*a*, and the protective film 19 disposed over the second major surface 2*b* may differ in configuration. For example, the protective film 19 disposed over the first major surface 2*a* may include the first-component insulative film 19*a* and the second-component insulative film 19*b*, whereas the protective film 19 disposed over the second major surface 2*b* may include only the second-component insulative film 19*b*.

As described above, in the acoustic wave device 1B according to the second example embodiment, a pair of electrodes (the functional electrode 30A) include the first electrode 31, which is disposed on the first major surface 2*a* of the piezoelectric layer 2, and the second electrode 32, which is disposed on the second major surface 2*b*. This configuration makes it possible to reduce or prevent fluctuations in frequency characteristics.

The example embodiments described above are intended to facilitate understanding of the present disclosure and not to be construed as limiting of the present disclosure. The present disclosure may be altered/modified without departing from its spirit and scope, and the present disclosure includes its equivalents.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a piezoelectric layer including a first major surface and a second major surface opposed to each other in a first direction;

at least one pair of electrodes on at least one of the first major surface or the second major surface; and a protective film covering at least a portion of the pair of electrodes; wherein the protective film includes:

a first-component insulative film including a first component and in contact with the pair of electrodes; and a second-component insulative film including a second component and located at a surface layer of the protective film;

the first-component insulative film has a higher moisture resistance than the second-component insulative film;

the second-component insulative film has a higher plasma resistance than the first-component insulative film; and in at least a portion of the protective film, the second-component insulative film is thinner than the first-component insulative film.

2. The acoustic wave device according to claim 1, wherein the first-component insulative film is a silicon nitride film, and the second-component insulative film is a silicon oxynitride film.

3. The acoustic wave device according to claim 1, wherein the first-component insulative film is a silicon nitride film, and the second-component insulative film is a silicon oxide film.

4. The acoustic wave device according to claim 1, wherein the first-component insulative film and the second-component insulative film are each a silicon oxynitride film, and the second-component insulative film has a higher oxygen content than the first-component insulative film.

5. The acoustic wave device according to claim 1, wherein the first-component insulative film is a silicon oxynitride film, and the second-component insulative film is a silicon oxide film.

6. The acoustic wave device according to claim 1, wherein the first-component insulative film and the second-component insulative film are each an aluminum oxide film, and the second-component insulative film has a higher oxygen content than the first-component insulative film.

7. The acoustic wave device according to claim 1, wherein the first-component insulative film and the second-component insulative film are each a titanium oxide film, and the second-component insulative film has a higher oxygen content than the first-component insulative film.

8. The acoustic wave device according to claim 1, wherein the first-component insulative film and the second-component insulative film are each a tantalum oxide film, and the second-component insulative film has a higher oxygen content than the first-component insulative film.

9. An acoustic wave device comprising:

a piezoelectric layer including a first major surface and a second major surface opposed to each other in a first direction;

at least one pair of electrodes on at least one of the first major surface or the second major surface; and a protective film covering at least a portion of the pair of electrodes; wherein the protective film includes:

a first-component insulative film including a first component and in contact with the pair of electrodes; and a second-component insulative film including a second component and located at a surface layer of the protective film;

the first-component insulative film is a silicon nitride film, and the second-component insulative film is a silicon oxynitride film; and in at least a portion of the protective film, the second-component insulative film is thinner than the first-component insulative film.

10. An acoustic wave device comprising:

a piezoelectric layer including a first major surface and a second major surface opposed to each other in a first direction;

at least one pair of electrodes on at least one of the first major surface or the second major surface; and a protective film covering at least a portion of the pair of electrodes; wherein the protective film includes:

a first-component insulative film including a first component and in contact with the pair of electrodes; and a second-component insulative film including a second component and located at a surface layer of the protective film;

the first-component insulative film is a silicon nitride film, and the second-component insulative film is a silicon oxide film; and in at least a portion of the protective film, the second-component insulative film is thinner than the first-component insulative film.

11. An acoustic wave device comprising:

a piezoelectric layer including a first major surface and a second major surface opposed to each other in a first direction;

at least one pair of electrodes on at least one of the first major surface or the second major surface; and a protective film covering at least a portion of the pair of electrodes; wherein the protective film includes:

a first-component insulative film including a first component and in contact with the pair of electrodes; and a second-component insulative film including a second component and located at a surface layer of the protective film;

the first-component insulative film and the second-component insulative film are each a silicon oxynitride film, and the second-component insulative film has a higher oxygen content than the first-component insulative film; and in at least a portion of the protective film, the second-component insulative film is thinner than the first-component insulative film.

12. An acoustic wave device comprising:

a piezoelectric layer including a first major surface and a second major surface opposed to each other in a first direction;

at least one pair of electrodes on at least one of the first major surface or the second major surface; and a protective film that covering at least a portion of the pair of electrodes; wherein the protective film includes:

a first-component insulative film including a first component and in contact with the pair of electrodes; and a second-component insulative film including a second component and located at a surface layer of the protective film;

the first-component insulative film is a silicon oxynitride film, and the second-component insulative film is a silicon oxide film; and in at least a portion of the protective film, the second-component insulative film is thinner than the first-component insulative film.

13. An acoustic wave device comprising:

a piezoelectric layer including a first major surface and a second major surface opposed to each other in a first direction;

at least one pair of electrodes on at least one of the first major surface or the second major surface; and a protective film covering at least a portion of the pair of electrodes; wherein the protective film includes:

a first-component insulative film including a first component and in contact with the pair of electrodes; and a second-component insulative film including a second component and located at a surface layer of the protective film; and the first-component insulative film and the second-component insulative film are each an aluminum oxide film, and the second-component insulative film has a higher oxygen content than the first-component insulative film.

14. An acoustic wave device comprising:

a piezoelectric layer including a first major surface and a second major surface opposed to each other in a first direction;

at least one pair of electrodes on at least one of the first major surface or the second major surface; and a protective film covering at least a portion of the pair of electrodes; wherein the protective film includes:

a first-component insulative film including a first component and in contact with the pair of electrodes; and a second-component insulative film including a second component and located at a surface layer of the protective film; and the first-component insulative film and the second-component insulative film are each a titanium oxide film, and the second-component insulative film has a higher oxygen content than the first-component insulative film.

15. An acoustic wave device comprising:

a piezoelectric layer including a first major surface and a second major surface opposed to each other in a first direction;

at least one pair of electrodes on at least one of the first major surface or the second major surface; and a protective film covering at least a portion of the pair of electrodes; wherein the protective film includes:

a first-component insulative film including a first component and in contact with the pair of electrodes; and a second-component insulative film including a second component and located at a surface layer of the protective film the first-component insulative film and the second-component insulative film are each a tantalum oxide film, and the second-component insulative film has a higher oxygen content than the first-component insulative film.

16. The acoustic wave device according to claim 1, wherein the pair of electrodes define an IDT electrode;

the IDT electrode includes:

a first busbar and a second busbar facing each other in a second direction that crosses the first direction;

at least one first electrode finger connected at a proximal end to the first busbar and extending in the second direction; and at least one second electrode finger connected at a proximal end to the second busbar and extending in the second direction.

17. The acoustic wave device according to claim 9, further comprising:

a support including a support substrate; wherein the first direction coincides with a direction of thickness of the support substrate, and the piezoelectric layer is provided at a side of the support in the first direction;

the support includes an air gap open at a side of the support near the piezoelectric layer in the first direction; and as seen in plan view in the first direction, at least a portion of the pair of electrodes overlaps the air gap.

18. The acoustic wave device according to claim 17, wherein the protective film in a region overlapping the air gap in the first direction includes the first-component insulative film in contact with the pair of electrodes, and the second-component insulative film located at the surface layer of the protective film.

19. The acoustic wave device according to claim 18, wherein the protective film includes:

a portion including the first-component insulative film and the second-component insulative film; and a portion including only the second-component insulative film;

the portion including the first-component insulative film and the second-component insulative film overlaps the air gap in the first direction; and in the portion including only the second-component insulative film, the second-component insulative film is in direct contact with the piezoelectric layer.

20. The acoustic wave device according to claim 18, wherein the protective film in a non-overlapping region not overlapping the air gap in the first direction includes only the second-component insulative film, and the second-component insulative film in the non-overlapping region is in direct contact with the piezoelectric layer.

21. The acoustic wave device according to claim 17, wherein the pair of electrodes define an IDT electrode;

the IDT electrode includes a first busbar and a second busbar facing each other in a second direction that crosses the first direction;

at least one first electrode finger connected at a proximal end to the first busbar and extending in the second direction; and at least one second electrode finger connected at a proximal end to the second busbar and extending in the second direction; and in plan view seen in the first direction, the first busbar or the second busbar is positioned to overlap a corner of the air gap.

22. The acoustic wave device according to claim 1, wherein the piezoelectric layer includes lithium niobate or lithium tantalate; and the lithium niobate or lithium tantalate of the piezoelectric layer has Euler angles (φ, θ, ψ) within a range represented by Expression (1), Expression (2), or Expression (3):

$$(0^\circ \pm 10^\circ,\ 0^\circ \text{ to } 20^\circ,\ \text{any } \psi) \tag{1}$$

$$\left(0^\circ \pm 10^\circ,\ 20^\circ \text{ to } 80^\circ,\ 0^\circ \text{ to } 60^\circ\left(1-(\theta-50)^2/900\right)^{1/2}\right) \text{ or} \tag{2}$$

$$\left(0^\circ \pm 10^\circ,\ 20^\circ \text{ to } 80^\circ,\ \left[180^\circ - 60^\circ\left(1-(\theta-50)^2/900\right)^{1/2}\right] \text{ to } 180^\circ\right); \text{ and}$$

$$\left(0^\circ \pm 10^\circ,\ \left[180^\circ - 30^\circ\left(1-(\psi-90)^2/8100\right)^{1/2}\right] \text{ to } 180^\circ,\ \text{any } \psi\right). \tag{3}$$

23. The acoustic wave device according to claim 1, wherein the pair of electrodes define an IDT electrode;

the IDT electrode includes:

a first busbar and a second busbar facing each other in a second direction that crosses the first direction;

at least one first electrode finger connected at a proximal end to the first busbar and extending in the second direction; and at least one second electrode finger connected at a proximal end to the second busbar and extending in the second direction; and a ratio d/p is less than or equal to about 0.5, where d is a film thickness of the piezoelectric layer, and p is a center-to-center distance between the first electrode finger and the second electrode finger that are adjacent to each other.

24. The acoustic wave device according to claim 23, wherein the ratio d/p is less than or equal to about 0.24.

25. The acoustic wave device according to claim 1, wherein the pair of electrodes define an IDT electrode;

the IDT electrode includes:

a first busbar and a second busbar facing each other in a second direction that crosses the first direction;

at least one first electrode finger connected at a proximal end to the first busbar and extending in the second direction; and at least one second electrode finger connected at a proximal end to the second busbar and extending in the second direction;

as seen in a direction in which the first electrode finger and the second electrode finger that are adjacent to each other face each other, a region where the first electrode finger and the second electrode finger that are adjacent to each other overlap is an excitation region; and a condition MR≤about 1.75 (d/p)+0.075 is satisfied, where MR is a metallization ratio of the area of the first electrode finger and the second electrode finger to the area of the excitation region.

26. The acoustic wave device according to claim 1, wherein the acoustic wave device is operable to generate a bulk wave in thickness shear mode.

27. The acoustic wave device according to claim 1, wherein the acoustic wave device is operable to generate a plate wave.

28. The acoustic wave device according to claim 1, wherein the pair of electrodes include:

a first electrode on the first major surface of the piezoelectric layer; and a second electrode on the second major surface.

* * * * *